(12) United States Patent
Berkey et al.

(10) Patent No.: US 6,783,898 B2
(45) Date of Patent: *Aug. 31, 2004

(54) PROJECTION LITHOGRAPHY PHOTOMASK BLANKS, PREFORMS AND METHOD OF MAKING

(75) Inventors: George Edward Berkey, Pine City, NY (US); Lisa Anne Moore, Corning, NY (US); Charles Chunzhe Yu, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 78 days.

This patent is subject to a terminal disclaimer.

(21) Appl. No.: 09/876,194

(22) Filed: Jun. 6, 2001

(65) Prior Publication Data

US 2001/0027025 A1 Oct. 4, 2001

Related U.S. Application Data

(63) Continuation of application No. 09/397,577, filed on Sep. 16, 1999, now Pat. No. 6,265,115.
(60) Provisional application No. 60/159,037, filed on Oct. 12, 1999, provisional application No. 60/123,861, filed on Mar. 12, 1999, and provisional application No. 60/119,805, filed on Feb. 12, 1999.

(51) Int. Cl.[7] .......................... G03F 9/00; C03C 15/00; B32B 17/06
(52) U.S. Cl. .......................... 430/5; 65/30.1; 428/426
(58) Field of Search .................. 430/5, 322; 428/426; 65/111, 397, 399, 30.1; 501/57

(56) References Cited

U.S. PATENT DOCUMENTS

| 1,283,333 A | 10/1918 | Shaw |
| 2,188,121 A | 1/1940 | Smith .................. 47/78.1 |
| 3,740,207 A | 6/1973 | Bogrets et al. .............. 65/67 |
| 3,933,454 A | 1/1976 | DeLuca ..................... 65/3 |
| 4,221,825 A | 9/1980 | Guerder et al. ............ 427/34 |

(List continued on next page.)

FOREIGN PATENT DOCUMENTS

| DE | 2704015 A1 | 8/1978 | .......... C03B/23/04 |
| EP | 0 147 029 | 7/1985 | ......... C03B/37/016 |

(List continued on next page.)

OTHER PUBLICATIONS

Douglas Allan, Charlene Smith, N.F. Borrelli and T. P. Seward III, *193–nm excimer–laser–induced densificaiton of fused silica*, Optics Letters/vol. 21, No. 24/Dec. 15, 1996, pp. 1960–1962.

(List continued on next page.)

*Primary Examiner*—S. Rosasco
(74) *Attorney, Agent, or Firm*—Siwen Chen

(57) ABSTRACT

The invention includes methods of making lithography photomask blanks. The invention also includes lithography photomask blanks and preforms for producing lithography photomask. The method of making a lithography photomask blank includes providing a soot deposition surface, producing $SiO_2$ soot particles and projecting the $SiO_2$ soot particles toward the soot deposition surface. The method includes successively depositing layers of the $SiO_2$ soot particle on the deposition surface to form a coherent $SiO_2$ porous glass preform body comprised of successive layers of the $SiO_2$ soot particles and dehydrating the coherent $SiO_2$ glass preform body to remove OH from the preform body. The $SiO_2$ is exposed to and reacted with a fluorine containing compound and consolidated into a nonporous silicon oxyfluoride glass body with parallel layers of striae. The method further includes forming the consolidated silicon oxyfluoride glass body into a photomask blank having a planar surface with the orientation of the striae layer parallel to the photomask blank planar surface.

81 Claims, 12 Drawing Sheets

U.S. PATENT DOCUMENTS

| | | | |
|---|---|---|---|
| 4,345,928 A | 8/1982 | Kawachi et al. | 65/18.2 |
| 4,363,647 A | 12/1982 | Bachman et al. | 65/18.2 |
| 4,612,023 A | 9/1986 | Kreutzer et al. | 65/32 |
| 4,650,511 A | 3/1987 | Koya et al. | 65/30.1 |
| 4,666,495 A | 5/1987 | Kreutzer et al. | 65/258 |
| 4,676,814 A | 6/1987 | Ross et al. | 65/3.12 |
| 4,789,389 A | 12/1988 | Schermerhorn et al. | 65/31.2 |
| 4,917,718 A | 4/1990 | Berkey | 65/108 |
| 5,043,002 A | 8/1991 | Dobbins et al. | 65/31.2 |
| 5,326,729 A | 7/1994 | Yaba et al. | 501/54 |
| 5,364,433 A | 11/1994 | Nishimura et al. | 65/17.4 |
| 5,410,428 A | 4/1995 | Yamagata et al. | 359/350 |
| 5,415,953 A | 5/1995 | Alpay et al. | 430/5 |
| 5,474,589 A | 12/1995 | Ohga et al. | 65/397 |
| 5,599,371 A | 2/1997 | Cain et al. | 65/413 |
| 5,609,666 A | 3/1997 | Heitmann | 65/421 |
| 5,655,046 A | 8/1997 | Todoroki et al. | 385/144 |
| 5,667,547 A | 9/1997 | Christiansen et al. | 65/17.4 |
| 5,668,067 A | 9/1997 | Araujo et al. | 501/54 |
| 5,679,125 A | 10/1997 | Hiraiwa et al. | 65/397 |
| 5,683,483 A | 11/1997 | Yosiaki et al. | 65/102 |
| 5,698,484 A | 12/1997 | Maxon | 501/54 |
| 5,699,183 A | 12/1997 | Hiraiwa et al. | 359/355 |
| 5,702,495 A | 12/1997 | Hiraiwa et al. | 65/17.1 |
| 5,702,847 A | 12/1997 | Tarumoto et al. | 430/5 |
| 5,707,908 A | 1/1998 | Komine et al. | 501/53 |
| 5,735,921 A | 4/1998 | Araujo et al. | 65/32.1 |
| 5,764,345 A | 6/1998 | Fladd et al. | 356/35.5 |
| 5,837,024 A | 11/1998 | Fabian | 65/17.4 |
| 5,935,733 A | 8/1999 | Scott et al. | 430/5 |
| 5,970,746 A | 10/1999 | Fujinoki et al. | 65/102 |
| 6,087,283 A | 7/2000 | Jinbo et al. | 501/54 |

FOREIGN PATENT DOCUMENTS

| | | | |
|---|---|---|---|
| EP | 0 163 752 | 12/1985 | C03B/37/018 |
| EP | 0 401 845 A2 | 12/1990 | G02B/1/00 |
| EP | 0 483 752 A2 | 5/1992 | C03C/3/06 |
| EP | 0 488 320 A1 | 6/1992 | C03C/3/06 |
| EP | 0 636 586 A1 | 2/1995 | C03C/3/06 |
| EP | 0 691 312 | 1/1996 | C03C/3/06 |
| EP | 0 694 312 | 1/1996 | C03C/3/06 |
| EP | 0 735 006 | 10/1996 | C03B/19/14 |
| EP | 0 870 737 A1 | 10/1998 | C03C/3/06 |
| EP | 0 607 433 B1 | 11/1998 | C03B/23/06 |
| EP | 0 901 989 A1 | 3/1999 | C03B/19/14 |
| EP | 1 084 995 A1 | 3/2000 | C03B/19/14 |
| EP | 1 035 084 | 9/2000 | C03C/3/06 |
| GB | 257590 | 3/1927 | |
| GB | 2184434 | 6/1987 | C03B/20/00 |
| JP | 67/22389 | 11/1967 | |
| JP | 62-235223 | 10/1987 | C03B/20/00 |
| JP | 63-210044 | 8/1988 | C03C/17/245 |
| JP | 1-138145 | 5/1989 | |
| JP | P2001-19450 A | 1/2001 | C03B/20/00 |
| WO | 98/27018 | 6/1998 | C03B/19/14 |
| WO | 98/52879 | 11/1998 | C03B/19/14 |
| WO | WO 00/24685 | 5/2000 | C03C/3/06 |

OTHER PUBLICATIONS

Roger J. Araujo, Nicholas F. Borrelli and Charlene Smith, *Induced Absorption in Silica (A Prliminary Model)*, SPIE vol. 3424, 1998, pp. 25–32.

George H. Beall, *Industrial Applications of Silica*, Reviews in Mineralogy, 29, pp. 469–505.

N.F. Borrelli, Charlene Smith, Douglas C. Allan and T.P. Seward III, *Densification of fused silica under 193–nm excitation*, J. Opt. Soc. Am B/Vol 14, No. 7/Jul. 1997, pp. 1606–1615.

J.W. Fleming and D.L. Wood, *refractive index dispersion and related properties in fluoring doped silica*, Applied Optics/vol. 22, No. 19/Oct. 1, 1983, pp.3102–3104.

David L. Griscom, *Optical Properties and Structure of Defects in Silica Glass*, The Centennial Memorial Issue, 99[10], 1991, pp. 926–942.

Hideo Hosono, Masafumi Mizuguchi, and Hiroshi Kawazoe, *Effects of fluorine dimer excimer laser radiaiotn on the optical transmission and defect formation of various types of synthetic $SiO_2$ glasses*, Applied Physics Letters, vol. 74, No. 19, May 10, 1999, pp. 2755–2757.

Toshio Ibuki et al., *Absorption Spectra of $SiCl_4$, $SiCl_6$, $SiF_3$ $CH_3$ and $GeF_4$ in the VUV Region*, Chemical Physics Letters, vol. 136, No. 5, May 15, 1987, pp. 447–450.

W.D. Kingery, H.K. Brown, and D. R. Uhlmann, *Introduction to Ceramics, Second Edition*, John Wiley & Sons, 1976. p. 654.

M. Kyoto, Y. Ohoga, S. Ishikawa, Y. Ishiguro, *Research and Development Group, Sumitomo Electric Industries Ltd*, 1993 Chapman and Hall, pp. 2738–2744.

I. H. Malitosn, *Interspecimen Comparison of the Refractive Index of Fused Silica*, Journal of the Optical Socieyt of America, vol. 55, No. 10, pp. 1205–1209.

James A. McClay and Angela S.L. McIntyre, *17 nm optical lithography:The accomplishments and the challenges*, Solid State Technology, Jun. 1999, pp. 57–68.

Taro Moritani et al., "*Glass Engineering Handbook*," Apr. 20, 1964, Asakura Shoten, p. 611, Clause 2.1 Fabrication.

M. Rothschild, D.J. Ehrlich & D.C. Shaver, *Effects Of Excimer Laser Irradiation On The Transmission, Index Of Refraction, And Density Of Ultraviolet Grade Fused Silica*, Appl. Phys. Lett 55(13) Sep. 25, 1999, pp. 1276–1278.

Charlene M. Smith, Lisa A. Moore, *Fused Silica for 157 nm Transmittance*, SPIE vol. 3676, Mar. 15–17, 1999, pp. 834–841.

D.R. Sempolinski, T.P. Seward, C. Smith, N. Borrelli, C. Rosplock, *Effects of Glass Forming conditions on the KrF–Excimer–Laser–Induced Optical Damage In Synthetic Fused Silica*, Journal of Non–Crystalline Solids 203 (1996) pp. 69–77.

Richard H. Strulen & donald W. Sweeney, *Extreme Ultraviolet Lithography*, Optics & Photonics News, Aug. 1999, vol. 10, No. 8, pp. 34–38.

Richard E. Schenker & William G. Oldham, *Ultraviolet–induced Densification In Fused Silica*, J. Appl. Phys. 82 (3), Aug. 1, 1997, pp. 1065–1071.

Koji Tsukuma, N. Yamada, S. Kondo, K. Honda & H. Segawa, *Refractive Index, Dispersion and Absorption of Fluorine–Doped Silica glass in the Deep UV Region*, Journal of Non–Crystalline Solids 127 (1991), pp. 191–196.

H. Takahashi, A. Oyobe, M. Kosuge & R. Setaka, *Characteristics of Fluorine–Doped Silica Glass*, Technical Digest: European Conference on Optical Communication, (1986) pp. 3–6.

K. Tsukuma, N. Yamada, S. Kondo, K. Honda & H. Segawa, *Refractive Index, Dispersion and Absorption of Fluorine–Doped Silica Glass in the Deep UV Region*, Journal of Non–crystalline Solids 127 (1991), pp. 191–196.

W. Vogel, Chemistry of Glass, The American Ceramic Society, Inc. (1985), pp. 203–205.

PTO: 96–0383, Journal, Title: Sheet Glass.

Corning HPFS®, ArF Grade, Product Literature, 1999.

Shin–Etsu Chemical Homepage, Semiconductor Materials Division, http://www.shinetsu.co.jp/english/profile/division/sem–div/sem–div.html, (May 17, 1999) pp. 1–2.

Purity and Chemical Reactivity, Isimoto Co., Ltd. Homepage, Purity and Chemical Reactivity, http://www.isimoto.com/isimoto/english/feature1.html, (May 17, 1999) pp. 1–3.

Products for Optics, Isimoto Co., Ltd. Homepage, http://www.isimoto.com/isimoto/english/variation 3.html, (May 17, 1999) pp. 1–2.

Product Information, Isimoto Co., Ltd. Homepage, http://www.isimoto.com/isimoto/english/product info. html, (May 17, 1999) pp. 1–4.

High Purity Quartz Glass Products, http://www.toshiba–ceramics.com/quartz.html, (May 17, 1999) pp. 1–2.

Heraeus Quarzglas, Fused Silica for 157 nm photomasks, Bruno Uebbing 157 nm workshop, Feb. 16, 1999 Phoenix/USA, pp. 1–5.

Heraeus, Product Literature, Quartz Glass for Optics Optical Properties, Edition 1994.

Heraeus Amersil, Product Literature, The Leader in Silica Glass & Fabricated Quartz Glass Semiconductor Products: CVD Tubes, (Sep. 14, 1999).

Heraeus Amersil, Product Literature, The Leader in Silica Glass & Fabricated Quartz Glass: Diffusion Tubes, (Sep. 14, 1999).

Heraeus Amersil, Product Literature, The Leader in Silica Glass & Fabricated Quartz Glass Semiconductor Products: Furnace Tubes, (Sep. 14, 1999).

Heraeus Amersil, Product Literature, The Leader in Silica Glass & Fabricated Quartz Glass Semiconductor Products: Windows, (Sep. 14, 1999).

Heraeus Amersil, Product Literature, The Leader in Silica Glass & Fabricated Quartz Glass Semiconductor Products: Optical Properite, (Sep. 14, 1999).

Heraeus Amersil, Product Literature, The Leader in Silica Glass & Fabricated Quartz Glass Semiconductor Products: Thermal Properties, (Sep. 14, 1999).

Heraeus Amersil, Product Literature, The Leader in Silica Glass & Fabricated Quartz Glass Semiconductor Products: Raw Materials, (Sep. 14, 1999).

Heraeus Amersil, Product Literature, The Leader in Silica Glass & Fabricated Quartz Glass Semiconductor Products: Corporate Profile, (Sep. 14, 1999).

Patent Abstracts of Japan, vol. 1996, No. 07, Jul. 31, 1996, JP. 08067530, Sumitomo Electric Ind Ltd., Mar. 12, 1996, Abstract.

Patent Abstracts of Japan, vol. 012, No. 191 (C–501), Jun. 3, 1988, JP 62–297233, Fujitsu Ltd., Dec. 24, 1987, Abstract.

Patent Abstracts of Japan, vol. 006, No. 252 (P–161), Dec. 10, 1982, JP 57–147604, Nippon Denki KK, Sep. 11, 1982, Abstract.

PROJECTION LITHOGRAPHY PHOTOMASK BLANKS, PREFORMS AND METHOD OF MAKING

CROSS REFERENCE TO RELATED APPLICATION(S)

This is a Continuation of application Ser. No. 09/397,577, filed Sep. 16, 1999 now U.S. Pat. No. 6,265,115, which, in turn, claims the benefit of priority of U.S. provisional patent application Ser. No. 60/124,471 filed Mar. 15, 1999.

This application claims priority to U.S. Provisional Patent Application Ser. No. 60/119,805 filed on Feb. 12, 1999 and U.S. Provisional Patent Application Ser. No. 60/123,861 filed on Mar. 12, 1999, and U.S. patent application Ser. No. 09/397,577, filed on Sep. 16,1999, and U.S. Provisional Patent Application Ser. No. 60/159,037 filed on Oct. 12, 1999 the content of which is relied upon and incorporated herein by reference in its entirety and the benefit of priority under 35 U.S.C. §§119 and 120 is hereby claimed.

BACKGROUND OF THE INVENTION

1. Field of the Invention

The present invention relates generally to lithography photomasks, and particularly to optical photolithography mask blanks for use in optical photolithography systems utilizing vacuum ultraviolet light (VUV) wavelengths below 193 nm, preferably below 175 nm, more preferably below 164 nm, such as VUV projection lithography systems utilizing wavelengths in the 157 nm region.

2. Technical Background

Projection optical photolithography systems that utilize the vacuum ultraviolet wavelengths of light below 193 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm and 193 nm wavelengths, but the commercial use and adoption of below 193 nm vacuum ultraviolet wavelengths such as 157 nm has been hindered by the transmission nature of such deep ultraviolet wavelengths in the 157 nm region through optical materials. Such slow progression by the semiconductor industry of the use of VUV light below 175 nm such as the 157 nm region light has been also due to the lack of economically manufacturable photomask blanks from optically transmissive materials. For the benefit of deep ultraviolet photolithography in the VUV 157 nm region such as the emission spectrum of the fluorine excimer laser to be utilized in the manufacturing of integrated circuits there is a need for mask blanks that have beneficial optical properties including good transmission below 164 nm and at 157 nm and that can be manufactured economically.

Photomask blanks used in such lithography systems are different from the other optical elements of the system such as lenses and mirrors in that the photomasks are generally very thin and play a unique part in the system in terms of providing a substrate for integrated circuit patterns that are projected through the system. Patterns of the integrated circuits to be made are formed on the surface of photomask blanks, so that an image of the pattern on the photomask blank can be projected through the lithography system and printed on a surface of an integrated circuit semiconductor wafer. Photomask blanks must meet very strict requirements for dimensional stability to avoid warping and shrinking and for optical properties such as high transmission in order to ensure extreme accuracy required to form very fine integrated circuit patterns and inhibit the distortion there of.

The present invention overcomes problems in the prior art and provides a means for economically manufacturing high quality improved photomask blanks that can be used to improve the manufacturing of integrated circuits with vacuum ultraviolet wavelengths.

SUMMARY OF THE INVENTION

Figure 1:
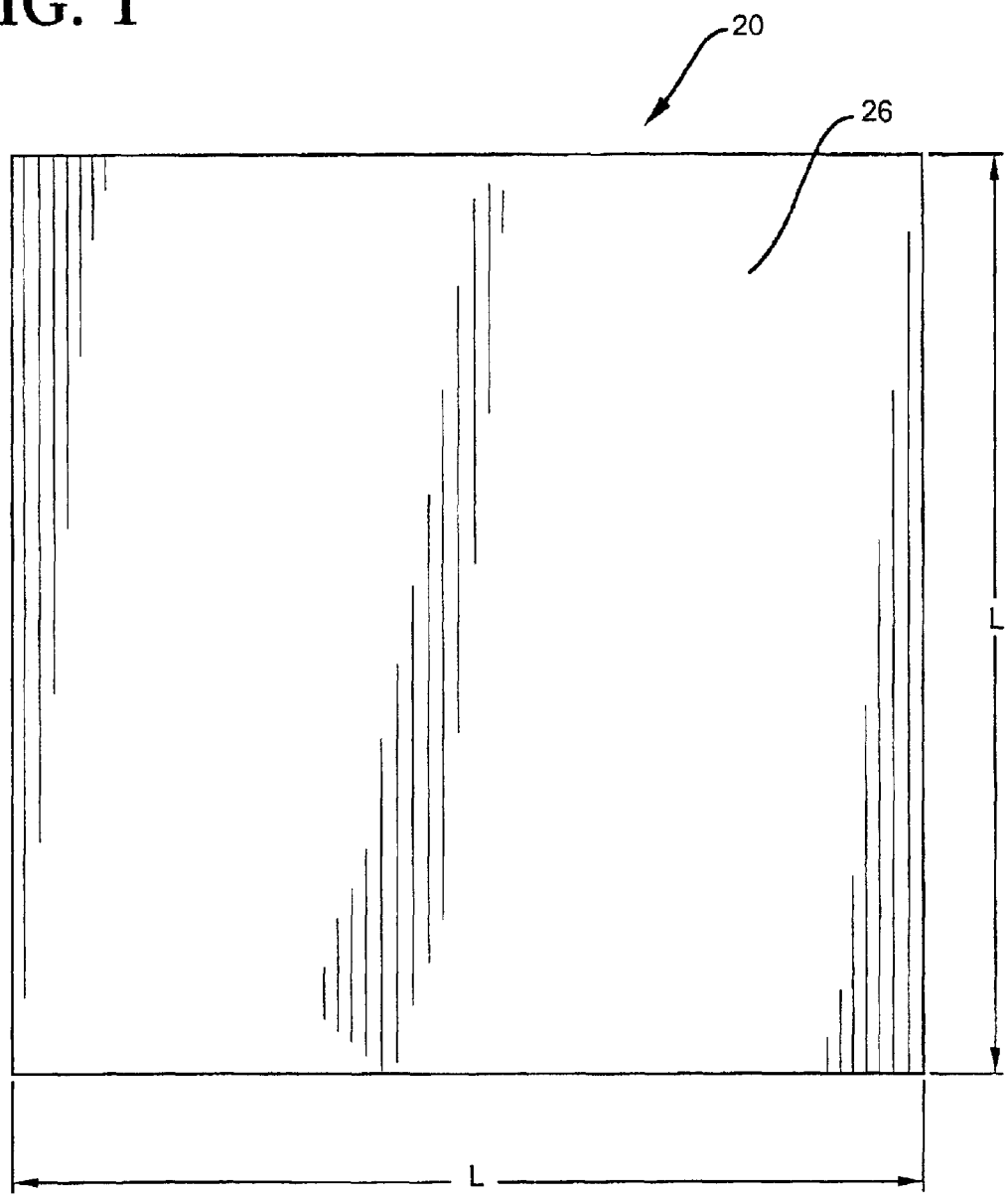
FIG. 1 is a top view of an embodiment of the invention.
Figure 2:
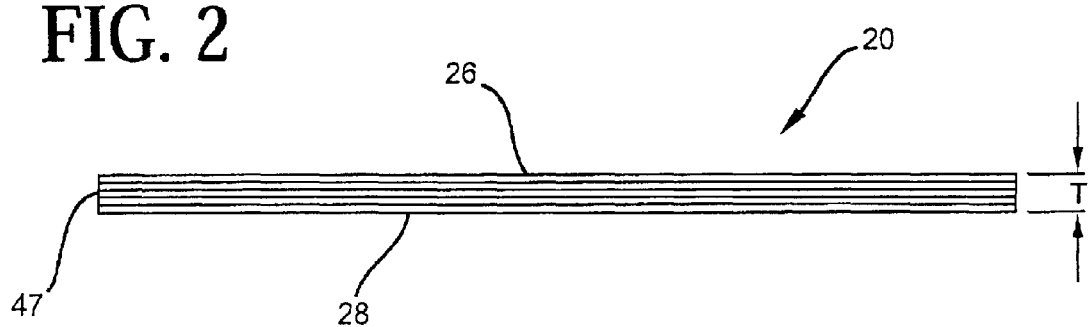
FIG. 2 is a side view of an embodiment of the invention.

One aspect of the present invention is a method of making a lithography photomask blank. The method of making a lithography photomask blank includes providing a soot deposition surface, producing $SiO_2$ soot particles and projecting the $SiO_2$ soot particles toward the soot deposition surface. The method includes successively depositing layers of the $SiO_2$ soot particle on the deposition surface to form a coherent $SiO_2$ porous glass preform body comprised of successive layers of the $SiO_2$ soot particles and dehydrating the coherent $SiO_2$ glass preform body to remove OH from the preform body. The $SiO_2$ is exposed to and reacted with a fluorine containing compound and consolidated into a nonporous silicon oxyfluoride glass body with parallel layers of striae. The method further includes forming the consolidated silicon oxyfluoride glass body into a photomask blank having a planar surface with the orientation of the striae layer parallel to the photomask blank planar surface.

In a further aspect, the present invention includes a method of making a lithography photomask blank which has a photomask blank large dimension L and a photomask blank thickness T. The method includes the steps of providing a cylindrical coherent $SiO_2$ porous glass preform column comprised of successive layers of $SiO_2$ soot particles; dehydrating the coherent $SiO_2$ porous glass preform column to remove OH from the column; exposing the $SiO_2$ to a fluorine containing atmosphere and consolidating the column into a nonporous consolidated silicon oxyfluoride glass column having parallel oriented layers of striae. The method further includes heating the consolidated silicon oxyfluoride glass column in order to flow out the glass column into a silicon oxyfluoride glass patty while maintaining the parallel layers of striae and inhibiting the disruption of the horizontal and parallel orientation of the layers of the striae. The method includes forming the silicon oxyfluoride glass patty into a photomask blank having a planar surface with layers of striae oriented parallel to the photomask blank planar surface.

In another aspect, the present invention includes a method of making a lithography photomask blank having a photomask blank large dimension L and a photomask blank thickness T. The method includes the steps of providing a cylindrical coherent $SiO_2$ porous glass preform column comprised of successive layers of $SiO_2$ soot particles, dehydrating the coherent porous glass preform column to remove OH from the preform column; exposing the coherent preform column to a fluorine containing atmosphere and consolidating the preform column into a nonporous consolidated silicon oxyfluoride glass column with a parallel layer of striae; and forming the consolidated silicon oxyfluoride glass column into a photomask blank having a planar surface with the parallel layers of striae parallel to the photomask blank planar surface.

In a further aspect, the present invention includes a glass lithography mask blank preform. The mask blank preform is a silicon oxyfluoride glass column with a planar surface end, the glass having an OH content $\leq 10$ ppm and a F wt. % concentration $\geq 0.5$ wt. %, with the silicon oxyfluoride glass column having parallel layers of striae which are parallel to the planar surface end of the silicon oxyfluoride glass column.

In another aspect, the present invention includes a glass lithography mask blank preform for forming a lithography mask blank having a mask blank large dimension L and a mask blank thickness T. The mask blank preform is a silicon oxyfluoride glass column with a planar surface end, with the silicon oxyfluoride glass column having parallel layers of striae which are parallel to the planar surface end, with the glass column having a column height CH and a column diameter CD wherein $(CD)^2 CH \geq L^2 T$.

In another aspect, the present invention includes a glass lithography mask blank preform for forming a lithography mask blank having a mask blank large dimension L and a silicon oxyfluoride glass column with a planar surface end, with the silicon oxyfluoride glass column having parallel layers of striae which are parallel to the planar surface end. The glass column has a column height CH and a column radius CR wherein $CR \geq L/2$ and $CH \geq T$, preferably $CR \geq \sqrt{2} (L/2)$ In a further aspect, the present invention includes a lithography photomask blank. The lithography photomask blank comprises a flat planar silicon oxyfluoride glass member having a top planar surface and a bottom planar surface. The silicon oxyfluoride glass has an OH content $\leq 10$ ppm and a F wt. % concentration $\geq 0.5$ wt. %. The silicon oxyfluoride glass has parallel layers of striae wherein the parallel layers of striae are parallel to the top surface and the top surface has a surface roughness $\leq 0.15$ nm rms.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

DETAILED DESCRIPTION OF THE PREFERRED EMBODIMENTS

Reference will now be made in detail to the present preferred embodiments of the invention, examples of which are illustrated in the accompanying drawings. An exemplary embodiment of a lithography photomask blank of the present invention is shown in FIG. 1 and is designated generally throughout by reference numeral 20.

In accordance with the invention, the present invention for a method of making a lithography photomask blank includes the steps of providing a soot deposition surface and producing a plurality of $SiO_2$ soot particles and projecting the $SiO_2$ soot particles towards the deposition surface. The method includes successively depositing layers of the $SiO_2$ soot particles on the deposition surface to form a coherent $SiO_2$ porous glass preform body comprised of a successive $SiO_2$ soot particle layer. The coherent $SiO_2$ porous glass preform body is dehydrated in order to remove OH (hydroxyl radicals) from the preform body. The $SiO_2$ is exposed to a fluorine containing atmosphere and consolidated into a consolidated silicon oxyfluoride glass body with parallel layers of striae. The consolidated silicon oxyfluoride glass body is then formed into a photomask blank with a planar surface that is parallel to the parallel layers of striae.

Figure 3:
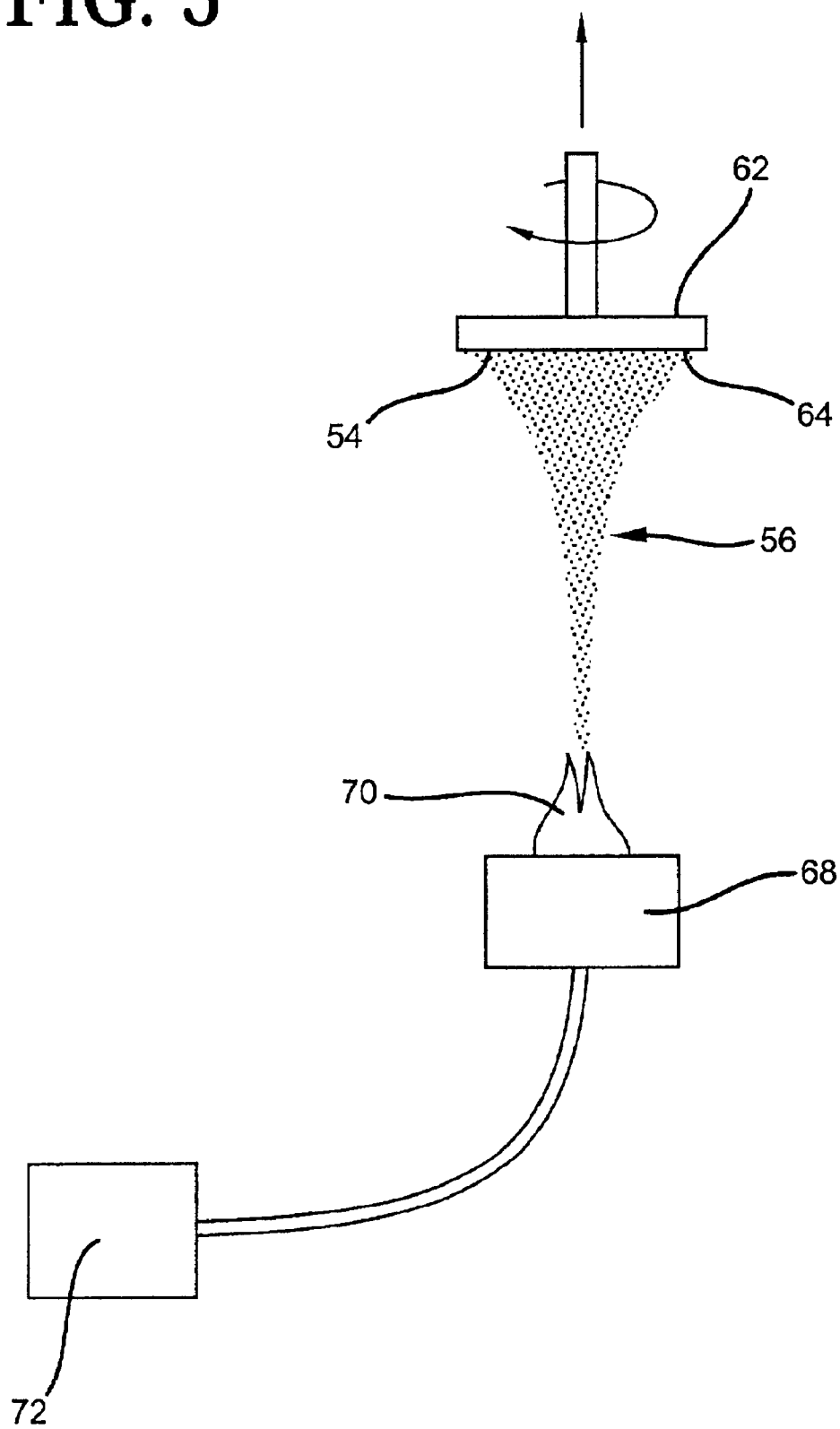
FIG. 3 shows a method of the invention.
Figure 4:
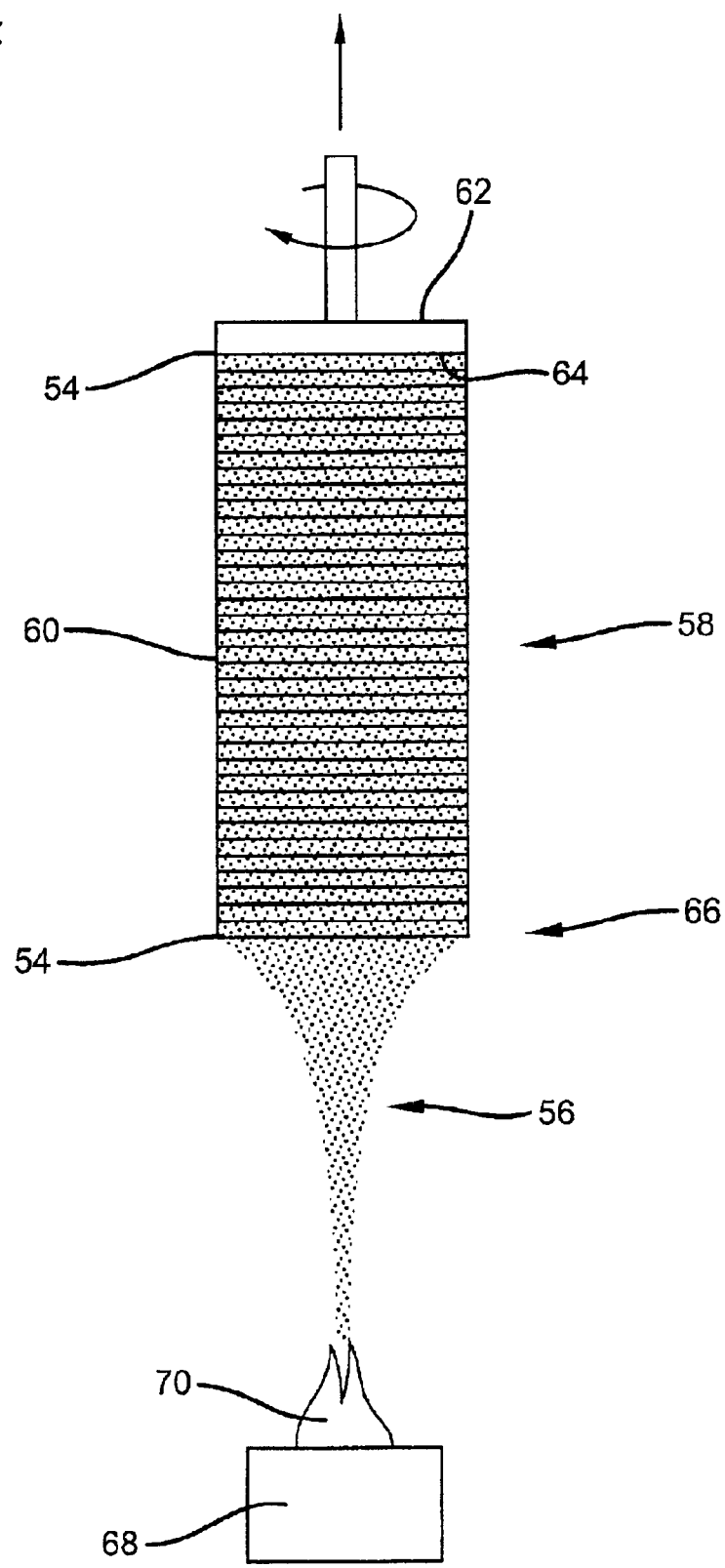
FIG. 4 shows a method of the invention.

As shown in FIG. 3, the invention includes providing soot deposition surface 54 and producing $SiO_2$ soot particle 56 and projecting soot particles 56 toward deposition surface 54. As shown in FIG. 4, the invention includes successively depositing layers of soot particles 56 on deposition surface 54 to form coherent $SiO_2$ porous glass preform body 58 which is comprised of successive $SiO_2$ soot particle layers 60. Providing soot deposition surface 54 includes providing substrate 62 which has a substrate initial deposition surface 64. At the start up of the process soot is first deposited on initial deposition surface 64 where there will be a substrate/soot body interface, and as the deposition process proceeds, soot deposition surface 54 is the leading edge of growing end 66 of porous preform body 58. As embodied in FIG. 3-5, initial deposition surface 64 of substrate 62 is a flat planar surface. As embodied in FIG. 6, initial deposition surface 64 of substrate 62 is curved which can provide an improved target for initial soot deposition. Substrate 62 and its surface 64 is made from a suitable target bait material such as glass, alumina, silica, or a previously made soot body. Surface 64 of substrate 62 can be of a composition the same as or approximate to the deposited formed glass or can be different from it.

Figure 5:
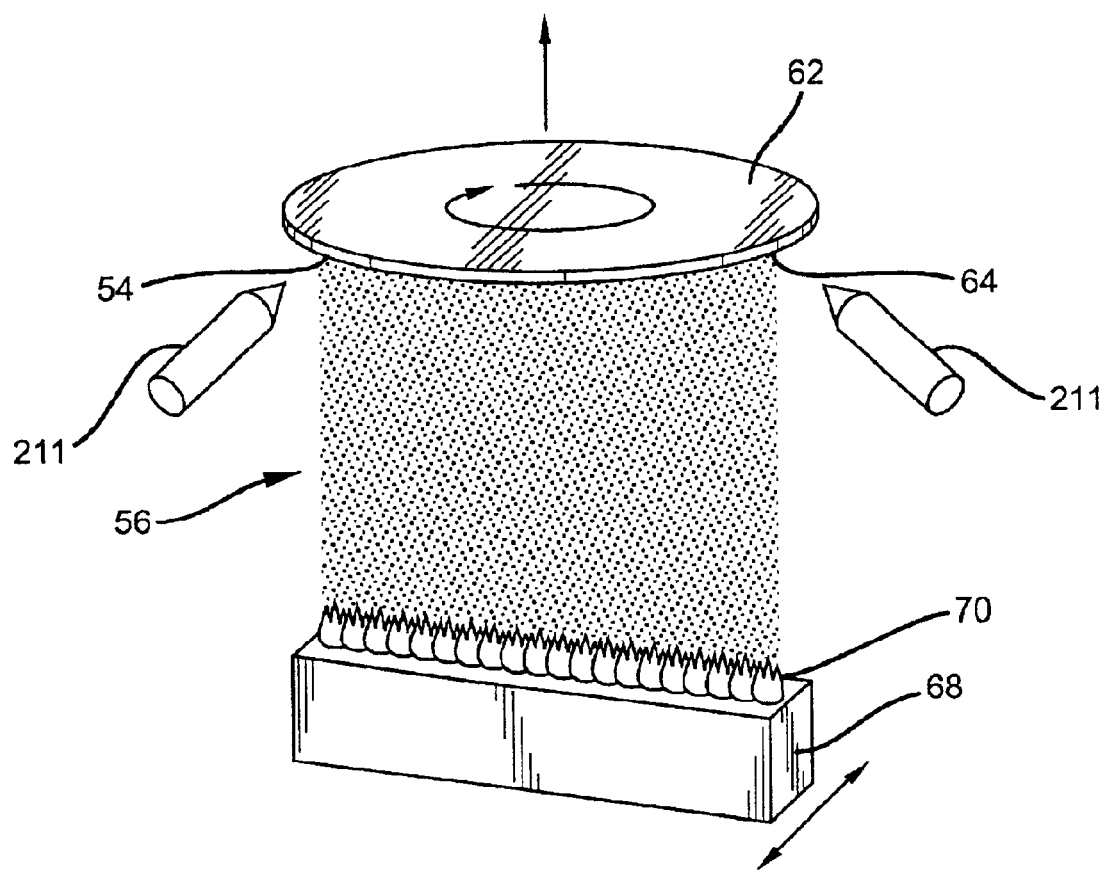
FIG. 5 shows a method of the invention.
Figure 6:
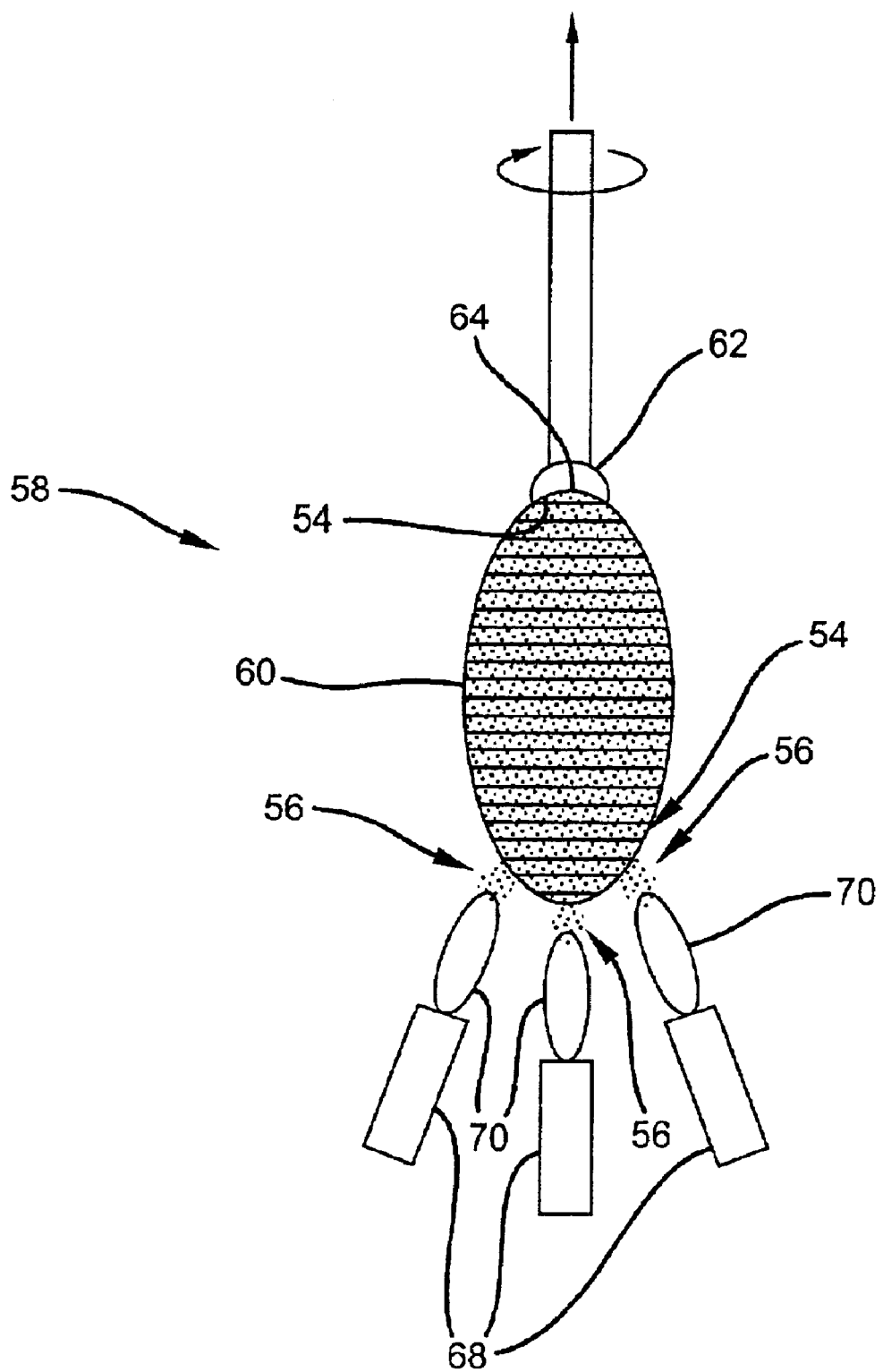
FIG. 6 shows a method of the invention.

As shown in FIGS. 3–6, producing and projecting $SiO_2$ soot particles 56 onto surface 54, preferably includes providing at least one $SiO_2$ soot deposition burner 68 which produces a conversion site flame 70 and feeding a $SiO_2$ feedstock 72 to burner 68 such that glass synthesizing conversion flame 70 converts the $SiO_2$ feedstock into a $SiO_2$ soot particle stream aimed at deposition surface 54. In a preferred embodiment, burner 68 is a vapor deposition glass soot synthesizing burner that produces a low turbulence flame 70 and SiO$_2$ soot particles, such as with concentric gas emitting regions such that soot 56 is deposited on surface 54 with the assistance of thermophoresis, preferably the burner produces a high temperature flame with a temperature of about $\geq 2000°$ C. In addition to feeding SiO$_2$ feedstock 72 to burner 68, oxygen, fuel (natural gas, methane, and/or hydrogen), and inert shield gases are fed to the burner to support flame 70 and produce an appropriate deposition stream of SiO$_2$ particles. In a preferred embodiment, the SiO$_2$ feedstock 72 fed to the burner is a halide free siloxane, preferably a cyclosiloxane, and most preferably is comprised of octamethylcyclotetrasiloxane (purity of at least 99 wt. % thereof. In an alternative embodiment the SiO$_2$ feedstock 72 fed to the burner is a halide containing SiO$_2$ feedstock such as silicon tetrachloride. Producing and projecting SiO$_2$ soot particles and successively depositing layers of the SiO$_2$ soot particles on deposition surface 54 to form a coherent SiO$_2$ porous glass preform body with successive SiO$_2$ soot particle layers preferably includes providing relative motion between burner 68 and soot deposition surface 54. As shown in FIGS. 3–6, preferred relative motion to achieve coherent SiO$_2$ porous glass preform body 58 includes rotating substrate 62 so that soot deposition surface 54 rotates relative to burner 68 and flame 70. Also substrate 62 is drawn away from burner 68 at a rate equal to the growth of preform body 58 and the advancement of soot deposition surface 54 so that the optimal deposition distance between surface 54 and flame 70 is maintained. FIGS. 3–4 show an embodiment of the invention utilizing a single burner with rotation and withdraw motion. FIG. 5 shows an embodiment of the invention utilizing a single longitudinal burner (length of flame 70 is several times longer than the width of the flame, with the length of flame 70 greater than or equal to the long dimension (diameter) of substrate 62) with the substrate 62 rotated and withdrawn. Substrate 62 of FIG. 5 can be a planar glass plate which is held by a chuck such as a vacuum chuck and the relative motion can include sweeping the burner back and forth with the translation and rotation providing uniform soot coverage. Additionally it is preferred to utilize soot densifying heat sources 211 to densify the outer perimeter of the soot preform body as it is built up to maintain the physical integrity and strength of the soot body. Densifying heat sources 211 can comprise heat producing burners which are positioned and fueled so as to effect densification of the outer perimeter of the soot body as it is built up. In a preferred embodiment heat sources 211 are a non-water producing heat source, such as a radiant energy heat source which locally heats the outer perimeter. A radiant laser heat source of appropriate wavelength and output can comprise heat sources 211. As an alternative to using translation and relative motion to provide uniform soot deposition, the supply of feedstock and soot production can be varied along with length of burner 68, such as just using rotation and withdraw motion combined with a varying soot producing flame 70 that produces more soot on the outer ends of burner 68 than in the center length of burner 68. The embodiment of FIG. 6 uses three burners with substrate 62 rotated and withdrawn as soot 56 is deposited on surface 54. Successively depositing layers of soot particles 56 to form coherent porous glass preform 58 includes depositing the soot particles by thermophoresis at a soot deposition temperature and with a soot deposition size wherein the deposited soot particles 56 are bonded together to form the coherent porous glass preform body. The preform body 58 has a free standing self supporting soot structure made up of a network of bonded and attached particles.

Figure 7:
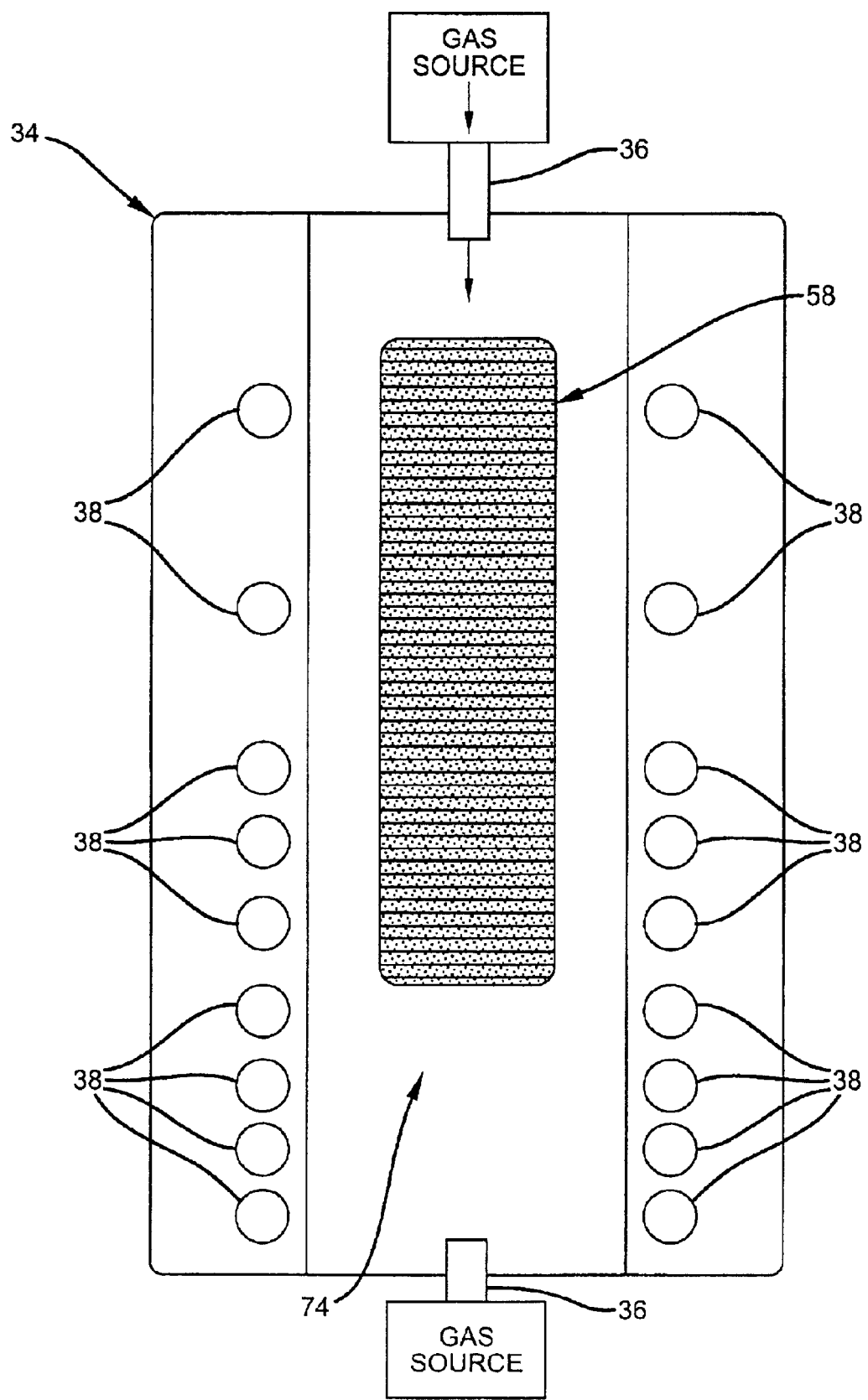
FIG. 7 shows a method of the invention.
Figure 8:
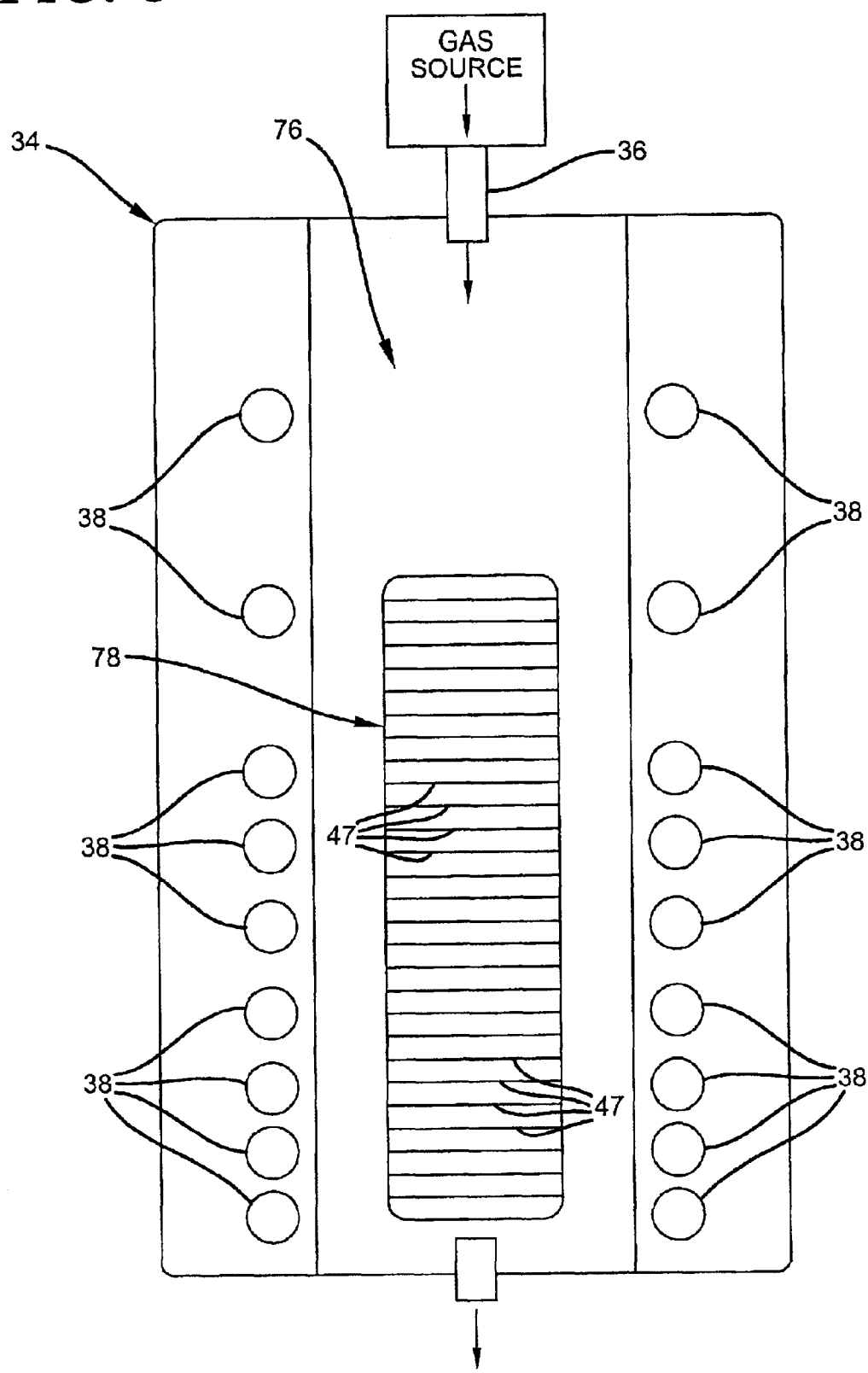
FIG. 8 shows a method of the invention.

A preferred silicon oxyfluoride glass is produced by providing a SiO$_2$ soot porous preform 32 and dehydrating the SiO$_2$ soot to remove OH from the SiO$_2$ soot. In addition to dehydrating the SiO$_2$ soot, the method preferably includes replacing some of the silicon (Si) to oxygen (O) bonds with silicon (Si) to fluorine (F) bonds and consolidating the soot into an inclusion-free vitreous silicon oxyfluoride glass. As shown in FIGS. 7–8, SiO$_2$ soot porous preform is dehydrated, fluorine doped by the formation of Si—F bonds and consolidated in furnace 34. Appropriate treatment and source gases are supplied to furnace 34 through gas input 36, to affect dehydration (removal of OH with a dehydration treatment agent), incorporation maintenance of F (fluorine source doping gas) and consolidation (preferably helium) of the soot porous preform into silicon oxyfluoride glass, preferably gas inputs/inlets are on both the top and bottom of the furnace. The temperature of the heated soot in furnace 34 can be controlled by adjusting the amount of energy supplied to heating elements 38 or moving the placement of the preform within furnace 34 in that the furnace has at least two temperature zones.

Dehydrating coherent SiO$_2$ porous glass preform body 58 removes OH from preform body 58 so as to result in a dry glass (less than 50 ppm OH), preferably with less than 10 ppm OH, more preferably less than 1 ppm OH. As show in FIG. 7, dehydrating preferably includes exposing coherent SiO$_2$ glass preform body 58 to a heated dehydrating atmosphere 74. Such exposure to a heated dehydrating atmosphere 74 can be achieved in a gas treatment preform dehydration/consolidation furnace 34 by heating with heating elements 38 and a preferably continuous delivery of a dehydrating atmosphere treatment through gas input 36. A preferred dehydrating atmosphere 74 is a heated halide containing atmosphere. The majority of the heated halide containing dehydration atmosphere is preferably made up of helium, with a halide containing gas including chlorine and/or fluorine making up the remainder. A preferred dehydrating atmosphere is helium and Cl$_2$. The dehydrating atmosphere can include fluorine as a halide dehydrating agent. Dehydrating removes OH (hydroxyl radical groups) from perform 58 to result in a glass with, preferably an OH content less than 50 ppm, and more preferably less than 10 ppm, and most preferably less than 1 ppm. Such OH levels in the resulting glass can be measured with infrared transmission at 2.7 microns. The dehydration treatment preferably has a dehydration treatment temperature in the range from about 900° C. to about 1100° C. Such low OH glass is preferably obtained by dehydrating and maintaining the dehydrated state of the soot precursors of the glass before, during the transformation of the precursor soot into glass. In addition to such a low OH level, the provided silicon oxyfluoride glass is of very high purity so that the silicon oxyfluoride glass consists essentially of Si, O and F. It is preferred that the silicon oxyfluoride glass has less than 10 ppm Cl, most preferably less than 1 ppm Cl, most preferably chlorine free. Such low Cl levels are preferably achieved by flushing out/replacement of Cl and exposure to F containing treatment atmosphere, particularly if the soot is exposed to Cl, such as during dehydrating with Cl. Preferably the silicon oxyfluoride glass has no absorption peak at 900 cm$^{-1}$ for Si—Cl. It is preferred that the silicon oxyfluoride glass has less than $1\times10^{17}$ H$_2$ molecules/cm$^3$, preferably less than $5\times10^{16}$ H$_2$ molecules/cm$^3$, more preferably less than $3\times10^{16}$ H$_2$ molecules. Preferably the silicon oxyfluoride glass has no absorption peak at 4,100 cm$^{-1}$ for hydrogen.

It is preferred that the silicon oxyfluoride glass is essentially free of Si to Si bonds and 165 nm oxygen deficiency absorbing centers. Such Si to Si bonds are preferably achieved by providing a silicon oxyfluoride glass produced with non-reducing atmosphere environments which do not have stoichimetrically low levels of oxygen present. Preferably the $SiO_2$ molecules and the glass are produced with stoichimetric or near stoichimetric levels of oxygen to minimize the formation of oxygen deficient Si to Si bonds. Preferably the glass has a 165 nm measured transmission of at least 75%, more preferably at least 80% and most preferably at least 85% per 5 mm thickness. Preferably the glass has a 157 nm internal transmission of at least 80%/cm and a 165 nm internal transmission of at least 85%/cm. More preferably the silicon oxyfluoride glass has a 157 nm internal transmission of at least 85%/cm and a 165 nm internal transmission of at least 90%/cm.

Preferably the silicon oxyfluoride glass does not exhibit a 215 nm absorbtion band after exposure to $F_2$ excimer radiation including the 157 nm wavelength. Most preferably a one mm thick piece of the silicon oxyfluoride glass after at least $0.96 \times 10^6$ pulses at 4 $mJ/cm^2$- pulse of $F_2$ excimer laser 157 nm radiation the glass has less than an 0.01 optical density ($log_{10}$ transmission) per mm increase at 215 nm and from 160 nm to 190 nm and more preferably less than 0.005 at 215 nm. Preferably the invention includes replacing any Si to Si bonds with Si to F bonds.

As shown in FIG. 8, dehydration/consolidation furnace 34 can be utilized for both dehydrating and exposing preform body 58 to fluorine containing atmosphere 76 and consolidating preform body 58 into consolidated silicon oxyfluoride glass body 78 with parallel layers of striae 47. Preferably OH is first removed by dehydrating and then fluorine is incorporated into the dehydrated $SiO_2$ soot and consolidated into silicon oxyfluoride glass column body 78 with the glass containing at least 0.5 wt. % F.

As shown in FIG. 7, $SiO_2$ soot preform 58 is positioned vertically in vertically oriented gas treatment furnace 34. Appropriate high purity treatment gases are input through gas inlet 36 and used to treat soot preform 58 and provide an appropriate consolidation atmosphere within furnace 34. OH is removed from the $SiO_2$ soot preform 58 and fluorine is incorporated into the $SiO_2$ soot and consolidating glass using dehydrating treatment gases, fluorine doping treatment gases, sintering treatment gases, dehydrating treatment temperatures, fluorine doping treatment temperatures and consolidating temperatures. Removing OH from the $SiO_2$ soot preform 58 includes heating the $SiO_2$ soot in a dehydrating atmosphere, which is maintained by supply of a dehydrating gas through inlet 36. Preferably the dehydrating atmosphere includes chlorine as a dehydrating gaseous agent. Preferred chlorine dehydrating gaseous agents are $Cl_2$, $SiCl_4$, and $CCl_4$, with $Cl_2$ most preferred. In addition to the chlorine dehydrating gaseous agent, the majority of the dehydrating atmosphere by weight %, is comprised of high purity helium. In a preferred method the dehydrating atmosphere also includes fluorine. The fluorine can be an additional dehydrating agent in the atmosphere such as with a chlorine/fluorine/helium dehydrating atmosphere or the fluorine can be the primary dehydrating agent such as a fluorine/helium dehydrating atmosphere with fluorine the minority by weight %. A fluorine primary dehydrating agent such as a fluorine/helium dehydrating atmosphere is a preferred embodiment in that it insures that chlorine is not incorporated into the glass so a chlorine free glass results. Silicon fluoride, preferably $SiF_4$, is the fluorine dehydrating agent with $CF_4$ as an alternative. An alternative fluorine dehydrating doping agent is $C_2F_6$. Incorporating fluorine into the $SiO_2$ soot includes exposing the $SiO_2$ soot to a heated atmosphere containing F, preferably at a fluorine doping treatment temperature greater than the dehydrating treatment temperature. The atmosphere containing F preferably includes silicon fluoride ($SiF_4$) as the F doping agent, with $CF_4$ as an alternative F doping agent. As with the dehydrating treatment atmosphere, helium preferably makes up the majority of the atmosphere. Preferably the supply of the F doping agent such as $SiF_4$ is continued while the soot is sintered and consolidated into the nonporous silicon oxyfluoride glass to insure proper incorporation of F into the glass and inhibit the removal of F from the glass. Preferably the soot is first dehydrated at a temperature in the range from preferably 900–1100° C. more preferably 1000–1100° C. such as with a $Cl_2$/helium atmosphere at a temperature of about 1000° C. then F doped at a temperature in the range from 1125–1325° C. more preferably 1150–1250° C. such as with a $CF_4$/helium atmosphere and a temperature of about 1225° C. then sintered in a sintering atmosphere in the range from 1350–1550° C. more preferably 1450–1500° C. such as a helium atmosphere and a temperature of about 1450° C. The transition from the low dehydrating temperature, to the medium F doping temperature, to the high sintering temperature can be achieved by increasing the energy supplied to heating elements 38, and is preferably achieved by moving the soot tube into a high temperature zone in the furnace 34, such as depicted at the bottom part of furnace 34 in FIG. 8 that has a high concentration of heating elements 38.

As an alternative to F doping after formation of the $SiO_2$ soot preform, F can be doped into the $SiO_2$ during the formation of the $SiO_2$ soot using a fluorine feedstock source atomsphere. Such fluorine doping during $SiO_2$ soot formation and deposition can be used as an alternative to subsequent fluorine doping steps when the fluorine doping level is sufficient and is maintained at a sufficient level through consolidation. In a preferred alternative embodiment fluorine doping during soot formation and deposition is utilized as a supplement/addition to subsequent fluorine doping steps. With fluorine doping at formation and then use of fluorine containing treatment atmospheres in subsequent process stops, elevated fluorine levels can be maintained based on equilibrium dynamics of fluorine content and presence prior to consolidation. Preferably with fluorine doping during formation deposition, the outer exterior circumference perimeter of soot has a lower permeability and porosity than the inner interior soot, so the escape of fluorine through the perimeter after deposition is inhibited. Such lowering of soot layer permeability can be achieved by manipulated deposition rates, hotter burner temperatures and denser soot. In a further alternative a lower permeability exterior outerlayer and a higher permeability interior may be used to inhibit fluorine escape and control the flow and content of treatment gasses within the soot preform. Such an assymetrical configuration can be formed using a very local densifying heat source, preferably a non-flame heat source such as a radiative heat generator. Soot densifying heat source 211 in FIG. 5 achieves such local porosity reduction.

$SiO_2$ soot preform 58 is dehydrated, F doped, and consolidated in furnace 34 to result in a silicon oxyfluoride glass column body 78 that consist essentially of Si, O, and F, preferably with the glass having a F wt. % concentration ranging from 0.5 to 3 wt. % and an OH wt. % content less than 10 ppm, preferably less than 1 ppm.

Fluorine is incorporated into the $SiO_2$ soot which is consolidated into a glass that contains at least 0.5 wt. % F, preferably with a fluorine weight % in the range from about 0.5 to about 2.5 wt. % F, more preferably 0.5 to 2 wt. F, and most preferably 0.5 to 1.5 wt. % F. Such fluorine levels can be achieved by consolidating the soot into a glass in an atmosphere containing F, or consolidating in a helium atmosphere after doping the soot with F. A preferred method treating SiO$_2$ soot preform 58 is OH removal by heating the soot to a temperature in the range from 900 to 1100° C. in an atmosphere containing Cl, incorporating fluorine into the dehydrated soot by heating to a temperature in the range from 1125 to 1325° C. in an atmosphere containing F, and then sintering the F doped soot at a temperature in the range from 1350 to 1550° C.

Figure 9A:
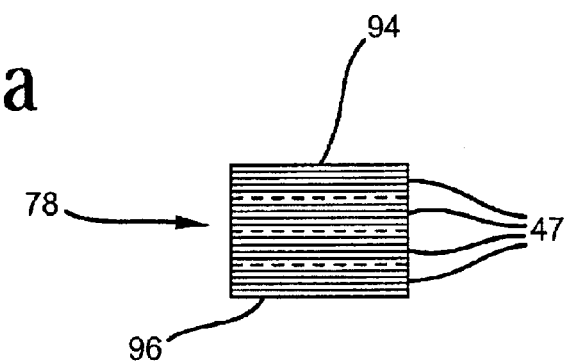
FIG. 9a shows a method of the invention.
Figure 9B:
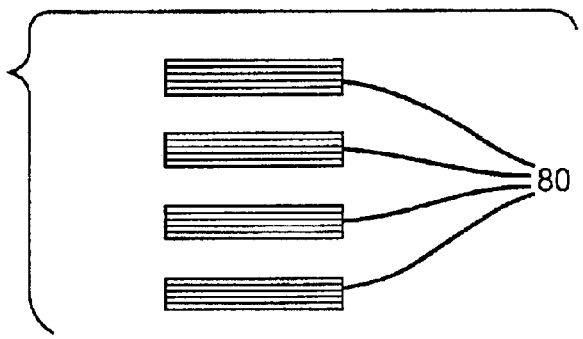
FIG. 9b shows a method of the invention.
Figure 9C:
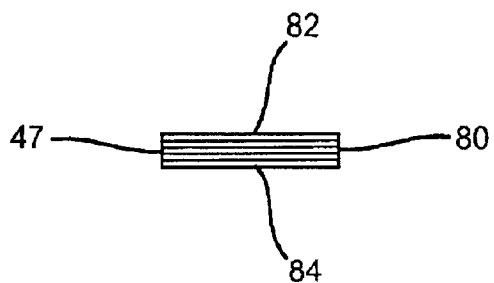
FIG. 9c a method of the invention.
Figure 9D:
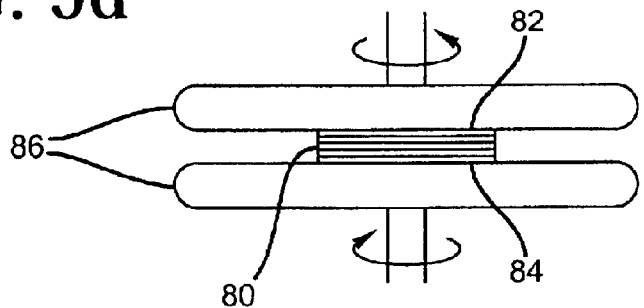
FIG. 9d shows a method of the invention.
Figure 9E:
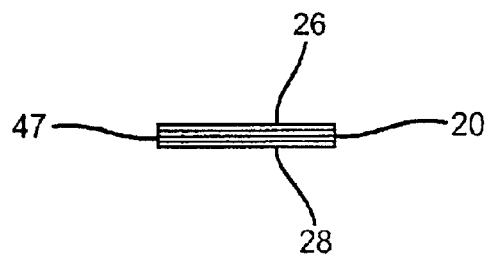
FIG. 9e shows a method of the invention.
Figure 10:
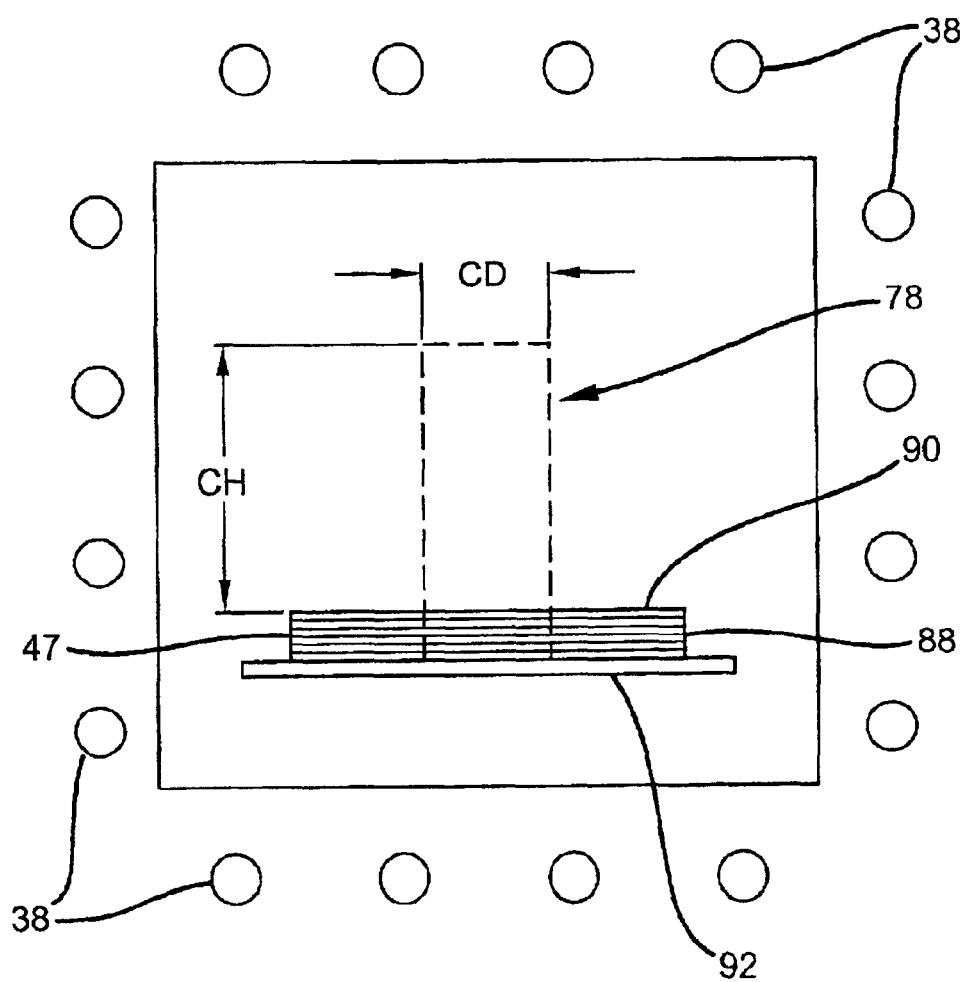
FIG. 10 shows a method of the invention.
Figure 12:
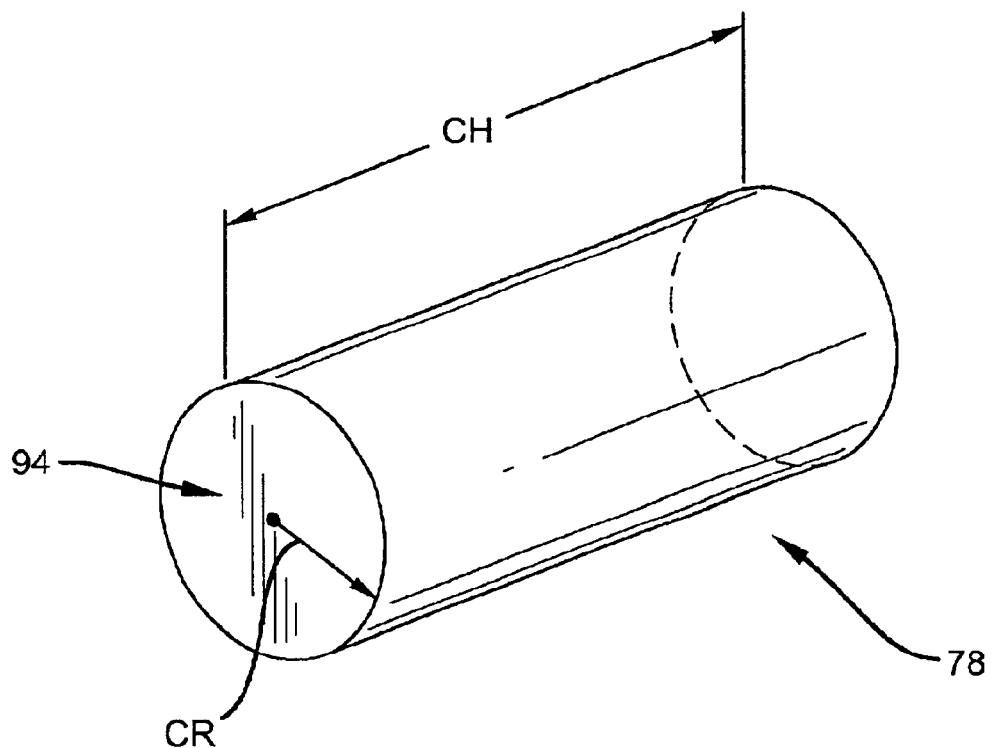
FIG. 12 is a perspective view of an embodiment of the invention and shows a method of the invention.

The invention includes forming consolidated silicon oxyfluoride glass body 78 into photomask blank 20 which has a top planar surface 26 and parallel layers of striae 47 that are parallel to top planar surface 26. Preferably bottom planar surface 28 is also parallel to top surface 26 and striae layers 47. Forming consolidated silicon oxyfluoride glass body 78 includes polishing the glass body 78 to provide photomask blank 20 with smooth planar surfaces 26 and 28. As depicted in FIGS. 9a through 9e, photomask blank 20 can be formed from consolidated silicon oxyfluoride glass column body 78 by cutting and polishing the silicon oxyfluoride glass. Silicon oxyfluoride glass column body 78 with parallel striae layers 47 can be cut into prefinished blanks 80 with prefinished blank top surface 82 and prefinished blank bottom surface 84 with surfaces 82 and 84 parallel to striae layers 47. Glass column 78 does not need to be cut or sliced if it is formed by soot depositing consolidation, and heat treatments to near net shape and dimensions of photomask blank 20. Prefinished blank 80 can then be finished by polishing, such as double sided polishing with polishing wheels 86 to result in a planar photomask blank surface, preferably with a surface roughness ≦0.15 nm rms. As depicted in FIGS. 1, 9 and 12, it is preferred that 2 CR≧L, and more preferably 2 CR≧($\sqrt{2}$)L. In a preferred alternative to cutting consolidated silicon oxyfluoride glass column body 78, as shown in FIG. 10, vertically oriented consolidated silicon oxyfluoride glass column 78 is heated to a high temperature in order to flow out glass column 78 into silicon oxyfluoride glass patty 88 while maintaining and inhibiting the disruption of the horizontal parallel orientation of striae layers 47 so that any existing striae layers 47 in flowed out glass patty 88 are substantially parallel to top flowed out glass patty surface 90 and bottom flowed out glass patty surface 92. Glass patty 88 can then be cut and/or polished to result in photomask blank 20 with planar top surface 26 and planar bottom surface 28.

Figure 13:
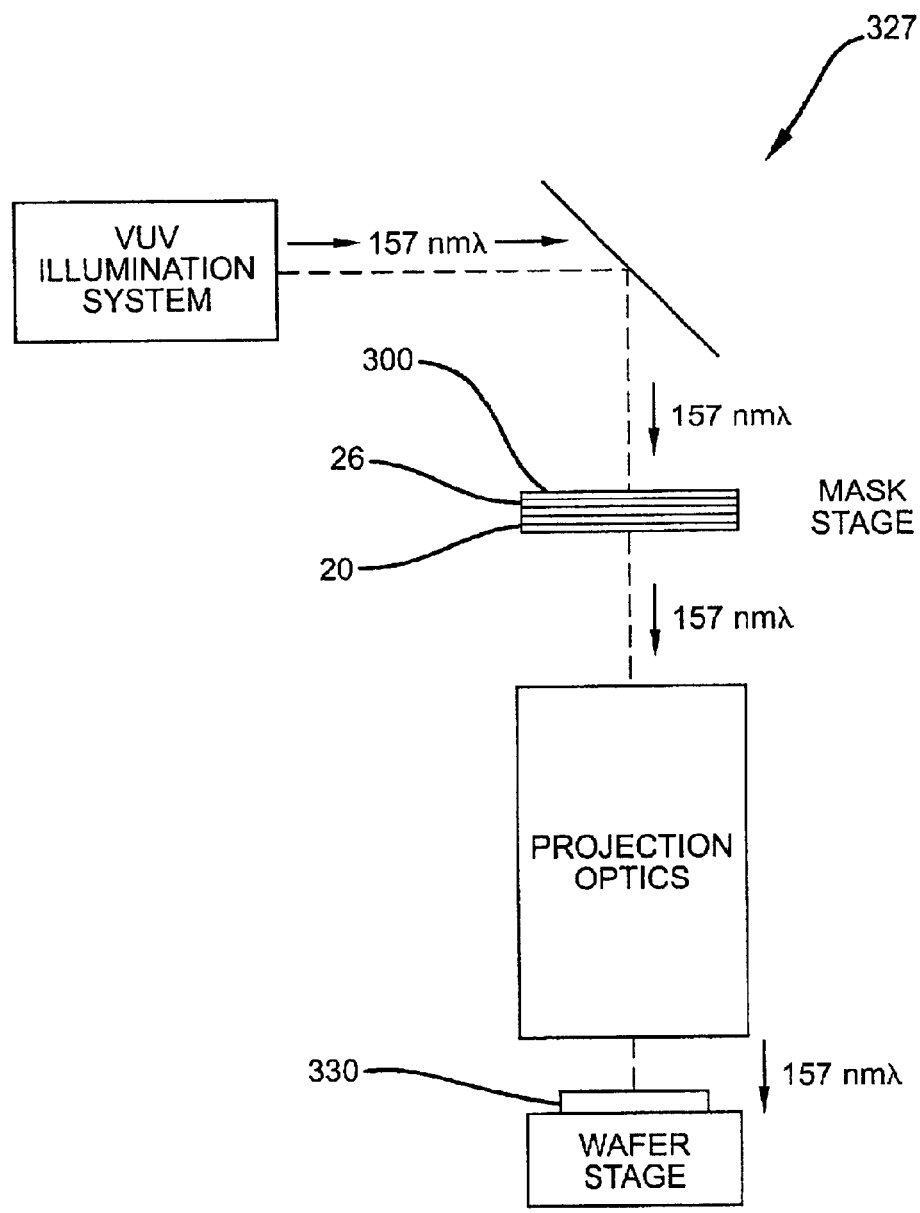
FIG. 13 is a lithography system/process embodiment of the invention.

As shown in FIG. 13, the invention includes transmitting 157 nm wavelength light through formed photomask blank planar surface 26 of photomask blank 20. VUV light below 193 nm of the F$_2$ excimer laser emission spectrum window which includes the 157 nm wavelength is transmitted through blank 20 during the inspection and qualification of the blank 20 for use in photolithography systems and when used as a transmitting photomask in a photolithography process. Mask blank 20 is used in F$_2$ excimer laser emission 157 nm wavelength region photolithography by forming a lithographic image pattern on the photomask blank planar surface. The invention includes impinging light that includes the 157 nm wavelength towards the photomask blank planar surface to form a projection image pattern and projecting the projection image pattern onto a radiation sensitive material. The invention includes photolithography utilizing mask 20.

The invention includes a method of making a lithography photomask blank having a photomask blank large dimension L and a photomask blank thickness T. The method of making photomask blank 20 includes providing coherent SiO$_2$ porous glass preform column 58. Preferably coherent porous preform column 58 has a generally cylindrical shape. Preferably coherent SiO$_2$ porous glass preform column 58 is comprised of a plurality of successive layers 60 of bonded SiO$_2$ soot particles 56. The method further includes dehydrating the provided coherent SiO$_2$ porous glass preform column 58 to remove OH from the column and exposing column 58 to a fluorine containing atmosphere and consolidating the coherent SiO$_2$ glass preform column into a consolidated silicon oxyfluoride glass column 78 having parallel oriented layers of striae 47. The consolidated silicon oxyfluoride glass column 78 is then heated to a flow out temperature in order to flow out column 78 into a silicon oxyfluoride glass patty 88 while inhibiting the disruption of the parallel orientation of the layers of striae. Silicon oxyfluoride glass patty 88 is then formed into photomask blank 20 with planar surface 26 oriented parallel to remaining layers of striae 47.

Figure 11:
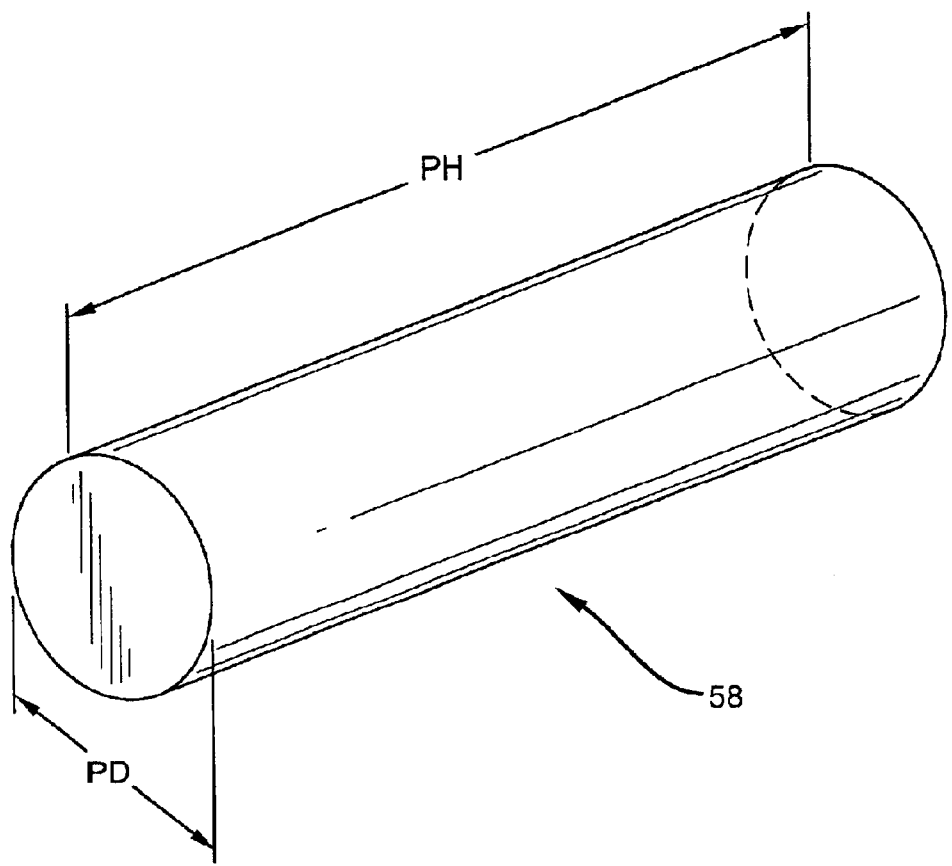
FIG. 11 is a perspective view of an embodiment of the invention and shows a method of the invention.

In the method of making photomask blank 20 it is preferred that the silicon oxyfluoride glass patty 88 has a diameter greater than L (the large dimension of photomask blank 20) and a thickness greater than T (the thickness of photomask blank 20), such that the photomask 20 can be efficiently formed from patty 88 such as by cutting and polishing. In the method of making photomask blank 20 with large dimension L and thickness T, consolidating and providing SiO$_2$ porous glass preform column 58 preferably includes consolidating the preform column into a consolidated silicon oxyfluoride glass column 78 having a column height CH and a column diameter CD wherein (CD)$^2$CH≧L$^2$T. In addition to consolidated column 78 having a CH and a CD such that (CD)$^2$CH≧L$^2$T, as depicted in FIG. 11, it is preferred that provided coherent SiO$_2$ porous glass preform column 58 has a preform height PH and a preform diameter PD with PH(PD)$^2$>2(CD)$^2$CH, such that the volumetric size of cylindrical shape of preform column 58 is at least twice that of glass column 78. More preferably PH(PD)$^2$≧8 (CD)$^2$CH so that the volume is approximately eight times more.

Heating vertically oriented glass column 78 preferably comprises heating the silicon oxyfluoride glass to a flowout temperature in the range from 1800° to 2300° C., preferably from about 1800° to about 2200°, and most preferably from about 1800° to about 2100° C. Flowing out glass column 78 while maintaining the horizontal striae orientation preferably includes applying a patty forming setter force to the glass column. Such application of a patty forming setter force can include placing a high purity dense graphite flat plate setter on top of vertically oriented column 78 and utilizing an inert furnace atmosphere. In such formation of patty 88, twisting or other such working of the viscous glass are avoided that might disrupt the parallel and horizontal orientation of striae layers 47. Preferably silicon oxyfluoride glass column 78 and patty 88 have an OH content ≦10 ppm and a F wt. % ≧0.5 wt. %, and most preferably consist essentially of Si, O and F.

The invention further includes a method of making a lithography photomask blank 20 having photomask blank large dimension L and thickness T. The method includes providing a cylindrical coherent SiO$_2$ porous glass preform column 58 comprised of successive layers of SiO$_2$ soot particles 60, dehydrating preform column 58 to remove OH, exposing the preform column 58 to a fluorine containing atmosphere and consolidating the column into a consolidated silicon oxyfluoride glass column 78 with parallel layers of striae 47, and forming the consolidated column 78 into a photomask blank having a planar surface 26 with parallel layers of striae 47 parallel to surface 26. Preferably the silicon oxyfluoride glass column and formed photomask blank have an OH content $\leq 10$ ppm and a F wt. % $\geq 0.5$ wt. % and most preferably consist essentially of Si, O and F. Preferably consolidated silicon oxyfluoride glass column 78 has a column height CH and a column radius CR, as depicted in FIG. 12, wherein CR$\geq$L/2 and CH$\geq$T. In addition to CR$\geq$L/2 and CH$\geq$T, it is preferred that coherent SiO$_2$ porous glass preform column 58 has a preform height PH and a preform diameter PD such that PH(PD$^2$)$\geq$8 CH(CR)$^2$. With such a preferred glass preform column 58 and silicon oxyfluoride glass column 78, photomask blank 20 can be efficiently manufactured from column 78 without the need for flowing out, in that column 78 is made to a size sufficient to allow forming of blank 70 such as with cutting and polishing.

In a further aspect the invention includes a glass lithography mask blank consolidated preform. Glass lithography mask blank consolidated preform 78 is preferably a silicon oxyfluoride glass column with an OH content <10 ppm, a F wt. % concentration $\geq 0.5$ wt. %, which has a planar surface end and parallel layers of striae. As shown in FIG. 9A, the planar surface end of silicon oxyfluoride glass column 78 such as planar surface end glass column top 94 and planar surface end glass column bottom 96 are parallel to parallel layers of striae 47. The silicon oxyfluoride glass of consolidated preform column 78 and resulting photomask blank 20 preferably has a fluorine content in the range from 0.5 to 3 wt. % F. Preferably the silicon oxyfluoride glass has a molecular H$_2$ content of less than 5×10$^{16}$ molecules/cm$^3$ and a chlorine content less than 10 ppm, and consists essentially of Si, O, and F. It is preferred that the silicon oxyfluoride glass has less than 10 ppm Cl, most preferably less than 1 ppm Cl. It is preferred that the silicon oxyfluoride glass has less than 1×10$^{17}$ H$_2$ molecules, more preferably less than 5×10$^{16}$ H$_2$ molecules, and most preferable has no detectable hydrogen. Such low chlorine and hydrogen levels in the glass are obtained by avoiding heat treatments of the glass in the presence of chlorine and H$_2$ molecules, such as with non-chlorine non-hydrogen furnace heating atmospheres including inert gases and fluorine containing gases so that incorporation of these contaminants into the glass is minimized and that any such entrapped contaminants can out gas from the glass, particularly with F replacing Cl. It is further preferred that the silicon oxyfluoride glass has a 157 nm light transmission percentage of at least 70% per 5 mm of thickness, and preferably is free of inclusions having a dimension >1 µm.

The invention further includes a glass lithography mask blank consolidated preform for forming a lithography mask blank with a mask blank large dimension L and a mask blank thickness T. Mask blank consolidated preform 78 is a silicon oxyfluoride glass column which has a planar surface end, parallel layers of striae which are parallel to the planar surface end, a column height CH and a column diameter CD such that (CD)$^2$ CH$\geq$L$^2$T. From such a silicon oxyfluoride glass column 78, lithography mask blank 20 can be efficiently manufactured by flowing out glass column 78 into glass patty 88 as shown in FIG. 10. Glass patty 88 flowed out from glass column 78 has a diameter greater than mask blank large dimension L and a thickness greater than mask blank thickness T so that mask blank 20 can be formed there from by cutting and polishing. The invention includes a glass lithography mask blank preform column 78, with mask blank 20 having a top planar surface 26 and a bottom planar surface 28, wherein the flat planar glass member includes parallel layers of striae 47 which are parallel to top planar surface 26 and bottom planar surface 28. Formed mask blank 20 has a mask blank large dimension L and a mask blank thickness T. The silicon oxyfluoride glass of mask blank 20 has an OH content $\leq 10$ ppm, a F wt. % concentration $\geq 0.5$ wt. %, and preferably consists essentially of Si, O, and F with a molecular H$_2$ content less than 5×10$^{16}$ molecules/cm$^3$ and a chlorine content less than 10 ppm Cl.

In a further aspect the invention includes a glass lithography mask blank consolidated preform for forming a lithography mask blank having a mask blank large dimension L and a mask blank thickness T. Glass lithography mask blank consolidated preform 78 is a silicon oxyfluoride glass column with parallel layers of striae. Glass mask blank preform 78 has a column height CH and a column radius CR such that CR$\geq$L/2 and CH$\geq$T. It is preferred that glass mask blank preform 78 has at least one planar surface end which is parallel to the parallel layers of striae 47. With such a preform a glass lithography mask blank 20 is formed such that mask blank 20 is a flat planar glass member with a top planar surface 26, a bottom planar surface 28, a mask blank large dimension L, and a mask blank thickness T wherein top planar surface 26 and bottom planar surface 28 are parallel to parallel layers of striae 47. Such a mask blank 20 is efficiently formed from preform 78 such as by cutting and polishing, preferably without the need for flowing out the glass. The silicon oxyfluoride glass of the mask blank has an OH content $\leq 10$ ppm, a F wt. % concentration $\geq 0.5$ wt. %, and preferably consists essentially of Si, O, and F. Most preferably the fluorine content is in the range of 0.5 to 3 wt. % F, and the glass has a molecular H$_2$ content less than 5×10$^{16}$ molecules/cm$^3$ and a chlorine content below 10 ppm.

In addition the invention includes a lithography photomask blank. Lithography photomask blank 20 is a flat planar silicon oxyfluoride glass member with top planar surface 26 and bottom planar surface 28. The silicon oxyfluoride glass has an OH content $\leq 10$ ppm and a F wt. % concentration $\geq 0.5$ wt. %. Photomask blank 20 includes parallel layers of striae 47 which are parallel to top planar surface 26 and planar surface 26 has a finished surface with a surface roughness $\leq 0.15$ nm rms. The silicon oxyfluoride glass preferably has a F wt. % content from 0.5 wt. % to 3 wt. %, and most preferably consists essentially of Si, O, and F. The planar silicon oxyfluoride glass member has a 157 nm light transmission percentage of at least 70% per 5 mm thickness of glass. With such a 157 nm transmission percentage, blank 20 preferably has a transmission uniformity at 157 nm in the range from −2% to +2%. It is preferred that photomask blank 20 has a birefringence $\leq 5$ nm/cm. Photomask blank 20 preferably is free of inclusions with dimensions >1 µm. Photomask blank 20 can be efficiently manufactured with the inventive methods and have these beneficial transmission homogeneity, low birefringence, and low inclusion levels. In a particularly preferred embodiment of the invention, lithography photomask blank 20 has a thickness of at least 0.6 cm, a length of at least 15 cm, is free of inclusions >1 µm, has a 157 nm transmission >70% and transmission uniformity at 157 nm within the range from −2% to +2%, and a birefringence $\leq 5$ nm/cm.

The invention provides a flat planar photomask blank for use with optical lithography light wavelengths below 193 nm, and are particularly adapted for use as transmissive photomasks with optical lithography in the Fluorine excimer laser emission VUV at 157 nm region. The invention results in large dry (preferably less than 1 ppm OH) high purity fluorine doped fused silica flat planar glass photomask blanks with striae in the glass parallel to the planar top and bottom surfaces of the blank, with the blanks having dimensions of at least 15 cm×15 cm×0.6 cm thick, and in a preferred embodiment at least 22 cm×22 cm×0.6 cm thick.

The inventive method of making the photomask blanks by heating and flowing out the consolidated glass preform column is particularly preferred in that it is able to adapt, utilize and take advantage of optical fiber manufacturing equipment such as optical fiber VAD laydown systems and optical fiber consolidation systems in the making of consolidated glass preform columns.

The preferred means of finishing the glass into a flat planar photomask blank with a surface roughness ≦0.15 nm rms is chemical mechanical finishing and polishing of the glass. The chemical mechanical finishing of the glass preferably includes polishing the surface of the glass to a surface roughness Ra ranging form 6 to 10 angstroms. This is preferably achieved by polishing with an aqueous solution of at least one metal oxide abrasive. The metal oxide abrasives can be chosen from alumina, titania, zirconia, germania, silica, and ceria, with the preferred metal oxide abrasive being cerium oxide. The surface is then further polished with an alkali aqueous solution of colloidal silica to a surface roughness Ra of 5 angstroms or less. The alkali solution of colloidal silica is buffered to a pH range of 8 to 12, preferably 10 to 12, and the colloidal silica particles have an average particle size less than or equal to 50 nm. The preferred surface roughness ≦0.15 nm rms is preferably achieved with a first polishing step of cerium oxide with a hard polishing pad (preferably blown polyurethane), second polishing step of cerium oxide with a soft polishing pad (preferably napped polyurethane) and a third step of colloidal silica with a soft pad (preferably napped polyurethane). Reference is made to U.S. patent application Ser. No. 09/364,143 filed on Jul. 30, 1999 in regards to chemical mechanical polishing steps and is incorporated herein.

As shown in FIG. 13, photomask blank 20 is utilized in a VUV wavelength projection lithography system 327. The invention includes forming a lithographic image pattern 300 on the photomask blank planar surface, preferably with a deposited Cr film, preferably to result in a 157 nm VUV wavelength lithography patterned transmission photomask. The invention includes impinging VUV light including the 157 nm wavelength on the photomask planar surface to form a projection image pattern and projecting the projection image pattern onto a radiation sensitive material 330. The VUV illumination system emits VUV light below 193 nm, preferably below 165 nm and in the 157 nm region such as emitted by a $F_2$ excimer laser.

Silica soot was doped with fluorine during formation and deposition. In addition to delivering $SiCl_4$ to the center forms tube of the combustion burner, fluorine doping source feedstock molecules were delivered to the combustion burner in order to form fluorine doped silica. Utilizing soot producing burners such as described in U.S. Pat. No. 5,599,371 (Cain et al., Feb. 4,1997) silica soot doped with fluorine and silicon oxyfluoride glass were formed. Silica soot with 3.5 wt. % F was produced by flowing 1.5 liter/m of $O_2$ and 1.5 liter/m of $CH_4$ to the flame premix to provide a soft flame. 1 liter/m of $SiCl_4$ and 1 liter/m $CF_4$ and 2000 cc/m of carrier $O_2$ was delivered to the fume tube. Additionally 1 liter/m of $SF_6$ was delivered to the innershield to improve F doping. The same delivery rates were used except 10 liter/m $O_2$ and 10 liter/m methane was delivered to the flame premix to provide a stronger flame, with the soot deposited as soot preform which was dried with chlorine during the consolidation into the glass with 1 wt. F. Improved silicon oxyfluoride glass may be provided by drying with fluorine and using fluorine treatment gases through consolidation to maintain F levels and avoid Cl contamination. Cl contamination is preferably inhibited by sufficient non-chlorine gas treatment exposures, preferably F doping gas treatment environments, prior to consolidation.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A method of making a lithography photomask blank, comprising the steps of:
   providing a soot deposition surface,
   producing a plurality of $SiO_2$ soot particles and projecting said $SiO_2$ soot particles towards said soot deposition surface,
   successively depositing said $SiO_2$ soot particles on said deposition surface to form a coherent $SiO_2$ porous glass preform body,
   dehydrating said coherent $SiO_2$ glass preform body to remove OH from said coherent $SiO_2$ glass preform body,
   exposing said $SiO_2$ to a fluorine containing atmosphere and consolidating the coherent $SiO_2$ glass preform body into a silicon oxyfluoride glass body having less than $1 \times 10^{17}$ $H_2$ molecules/cm$^3$,
   forming said consolidated silicon oxyfluoride glass body into a photomask blank having less than $1 \times 10^{17}$ $H_2$ molecules/cm$^3$ and a planar surface.

2. A method as claimed in claim 1, wherein providing a soot deposition surface includes providing a substrate, said substrate having a substrate initial deposition surface.

3. A method as claimed in claim 2, wherein said substrate initial deposition surface is curved.

4. A method as claimed in claim 2, wherein said substrate initial deposition surface is a flat planar surface.

5. A method as claimed in claim 1, wherein producing and projecting $SiO_2$ soot particles includes providing a $SiO_2$ soot deposition burner which produces a conversion site flame, feeding a $SiO_2$ feedstock to the burner wherein said flame converts said feedstock into a $SiO_2$ soot particle stream aimed at said deposition surface.

6. A method as claimed in claim 5, wherein producing and projecting said $SiO_2$ soot particles and successively depositing said $SiO_2$ soot particles further includes providing relative motion between said burner and said soot deposition surface.

7. A method as claimed in claim 1, the step of successively depositing said soot particles to form a coherent porous glass preform further includes depositing said soot particles by thermophoresis at a soot deposition temperature and with a soot deposition size wherein said deposited soot particles are bonded together to form said coherent porous glass preform body.

8. A method as claimed in claim 1, wherein dehydrating further includes, exposing said coherent $SiO_2$ glass preform body to a heated halide containing atmosphere.

9. A method as claimed in claim 8, wherein said heated halide containing atmosphere is comprised of helium and chlorine.

10. A method as claimed in claim 8, wherein said heated halide containing atmosphere includes fluorine.

11. A method as claimed in claim 1, wherein exposing said preform body to said fluorine containing atmosphere and consolidating the preform body into a silicon oxyfluoride glass body includes replacing a plurality of silicon to oxygen bonds with a plurality of silicon to fluorine bonds.

12. A method as claimed in claim 1, wherein said fluorine containing atmosphere includes $SiF_4$.

13. A method as claimed in claim 1, wherein said fluorine containing atmosphere includes $CF_4$.

14. A method as claimed in claim 1, wherein said fluorine containing atmosphere includes $C_2F_6$.

15. A method as claimed in claim 1, wherein said fluorine containing atmosphere includes $SF_6$.

16. A method as claimed in claim 1, wherein exposing said $SiO_2$ to a fluorine containing atmosphere comprises exposing said $SiO_2$ to a fluorine source compound concurrent with producing said $SiO_2$ soot particles and projecting said $SiO_2$ soot particles.

17. A method as claimed in claim 16, further comprising exposing said coherent $SiO_2$ porous glass preform body to a fluorine containing atmosphere.

18. A method as claimed in claim 1, wherein said fluorine containing atmosphere includes helium.

19. A method as claimed in claim 1, wherein OH is first removed by dehydrating and fluorine is incorporated into the dehydrated $SiO_2$ soot and consolidated into said silicon oxyfluoride glass body with said glass containing at least 0.5 wt. % F.

20. A method as claimed in claim 1, wherein said consolidated silicon oxyfluoride glass consists essentially of Si, O, and F.

21. A method as claimed in claim 1, wherein said consolidated silicon oxyfluoride glass has a F wt. % concentrated ranging from 0.5 to 3 wt. % and has an OH content less than 10 ppm.

22. A method as claimed in claim 1, wherein dehydrating includes heating the preform body to a temperature in the range from 900 to 1100° C. in a dehydrating atmosphere, and exposing to said fluorine containing body and consolidating into a silicon oxyfluoride glass includes heating the dehydrated preform body to a temperature in the range from 1125 to 1325° C. in an atmosphere containing F, and then sintering said preform body at a temperature in the range from 1350° C. to 1550° C.

23. A method as claimed in claim 1, wherein forming said consolidated silicon oxyfluoride glass body into a photomask blank having a planar surface further includes polishing said silicon oxyfluoride glass body.

24. A method as claimed in claim 1, further comprising transmitting 157 nm wavelength light through said formed photomask blank planar surface.

25. A method as claimed in claim 1, further comprising forming a lithographic image pattern on said photomask blank planar surface.

26. A method as claimed in claim 25, further comprising impinging light including the 157 nm wavelength towards said photomask blank planar surface to form a projection image pattern and projecting the projection image pattern onto a radiation sensitive material.

27. A method as claimed in claim 1, wherein said silicon oxyfluoride glass body has less than $5 \times 10^{16}$ $H_2$ molecules/$cm^3$.

28. A method as claimed in claim 1, wherein said silicon oxyfluoride glass body has no detectable hydrogen.

29. A method of making a lithography photomask blank having a photomask blank large dimension L and a photomask blank thickness T comprising the steps of:

providing a coherent $SiO_2$ porous glass preform column, dehydrating said coherent $SiO_2$ porous preform column to remove OH from said coherent $SiO_2$ glass preform column, exposing said $SiO_2$ to a fluorine containing atmosphere and consolidating the coherent $SiO_2$ glass preform column into a consolidated silicon oxyfluoride glass having less than $1 \times 10^{17}$ $H_2$ molecules/$cm^3$, forming said silicon oxyfluoride glass into a photomask blank having less than $1 \times 10^{17}$ $H_2$ molecules/$cm^3$ and a planar surface.

30. A method as claimed in claim 29, wherein consolidating and providing said $SiO_2$ porous glass preform column further includes consolidating the preform column into a consolidated silicon oxyfluoride glass column having a column height CH and a column diameter CD, wherein $(CD)^2 CH \geq L^2 T$.

31. A method as claimed in claim 30, wherein said silicon oxyfluoride glass has a diameter greater than L and a thickness greater than T.

32. A method as claimed in claim 31, wherein said diameter is greater than $\sqrt{2}$ L.

33. A method as claimed in claim 30, wherein said $SiO_2$ porous glass preform column has a preform height PH and a preform diameter PD, with $PH(PD)^2 \approx 8(CD)^2$ CH.

34. A method as claimed in claim 30, said method including heating said glass column to a flow temperature in the range from 1800 to 2300° C.

35. A method as claimed in claim 34, wherein heating said glass column includes applying a force to the glass column.

36. A method as claimed in 29, wherein said silicon oxyfluoride glass consists essentially of Si, O, and F.

37. A method as claimed in 29, wherein said silicon oxyfluoride glass has an OH content $\leq 10$ ppm and a F wt. % of at least 0.5 wt. %.

38. A method as claimed in claim 29, wherein said silicon oxyfluoride glass column has less than $5 \times 10^{16}$ $H_2$ molecules/$cm^3$.

39. A method as claimed in claim 29, wherein said silicon oxyfluoride glass column has no detectable hydrogen.

40. A method of making a lithography photomask blank having a photomask blank large dimension L and a photomask blank thickness T comprising the steps of:

providing a cylindrical coherent $SiO_2$ porous glass preform column comprised of a plurality of $SiO_2$ soot particles, dehydrating said coherent $SiO_2$ porous glass preform column to remove OH from said coherent $SiO_2$ glass preform column, exposing said coherent $SiO_2$ glass preform column to a fluorine containing atmosphere and consolidating the coherent $SiO_2$ glass preform column into a consolidated silicon oxyfluoride glass column having less than $1 \times 10^{17}$ $H_2$ molecules/$cm^3$ and forming said consolidated silicon oxyfluoride glass column into a photomask blank having a planar surface.

41. A method as claimed in claim 40, wherein said consolidated silicon oxyfluoride glass column has a column height CH and a column radius CR wherein $CR \geq L/2$ and $CH \geq T$.

42. A method as claimed in claim 41, wherein $CR \geq (\sqrt{2})L/2$.

43. A method as claimed in claim 41, wherein said $SiO_2$ porous glass preform column has a preform height PH and a preform diameter PD, with $PH(PD)^2 \geq 8CH(CR)^2$.

44. A method as claimed in 40, wherein said silicon oxyfluoride glass consists essentially of Si, O, and F.

45. A method as claimed in claim 40, wherein said silicon oxyfluoride glass has an OH content $\leq 10$ ppm and a F wt. % $\geq 0.5$ wt. %.

46. A method as claimed in claim 40, wherein said silicon oxyfluoride glass column has less than $5 \times 10^{16}$ $H_2$ molecules/$cm^3$.

47. A method as claimed in claim 40, wherein said silicon oxyfluoride glass column has no detectable hydrogen.

48. A glass lithography mask blank consolidated preform comprising a silicon oxyfluoride glass column having an OH content $\leq 10$ ppm, a F wt. % concentration $\geq 0.5$ wt. %, said silicon oxyfluoride glass column having less than $1 \times 10^{17}$ H$_2$ molecules/cm$^3$.

49. A mask blank preform as claimed in claim 48, wherein said silicon oxyfluoride glass consists essentially of Si, O, and F.

50. A mask blank preform as claimed in claim 49, wherein silicon oxyfluoride glass has a molecular H$_2$ content of less than $5 \times 10^{16}$ molecules/cm$^3$.

51. A mask blank preform as claimed in claim 49, wherein silicon oxyfluoride glass has a chlorine content less than 10 ppm.

52. A mask blank preform as claimed in claim 48, wherein said silicon oxyfluoride glass has a fluorine content in the range from 0.5 to 3 wt. % F.

53. A mask blank preform as claimed in claim 48, wherein said silicon oxyfluoride glass has a 157 nm light transmission percentage of at least 70% per 5 mm thickness of glass.

54. A mask blank preform as claimed in claim 48, wherein said silicon oxyfluoride glass column is free of inclusions having a dimension >1 µm.

55. A glass lithography mask blank formed from a glass lithography mask blank preform as claimed in claim 54, wherein said mask blank is comprised of a flat planar glass member having a top planar surface, a bottom planar surface, a mask blank large dimension L and a mask blank thickness T.

56. A preform as claimed in claim 48, wherein said silicon oxyfluoride glass column has no detectable hydrogen.

57. A glass lithography mask blank consolidated preform for forming a lithography mask blank having a mask blank large dimension L and a mask blank thickness T, said mask blank preform comprising a silicon oxyfluoride glass column having less than $1 \times 10^{17}$ H$_2$ molecules/cm$^3$ and a column height CH and a column diameter CD, wherein $(CD)^2 CH \geq L^2 T$.

58. A glass mask blank preform as claimed in claim 57, wherein said silicon oxyfluoride glass has an OH content $\leq 10$ ppm, and a F wt. % concentration $\geq 0.5$ wt. %.

59. A glass mask blank preform as claimed in claim 57, wherein said silicon oxyfluoride glass consists essentially of Si, O, and F.

60. A glass mask blank preform as claimed in claim 57, wherein said silicon oxyfluoride glass has a fluorine content in the range from 0.5 to 3 wt. % F.

61. A glass mask blank preform as claimed in claim 57, wherein said silicon oxyfluoride glass has a molecular H$_2$ content of less than $5 \times 10^{16}$ molecules/cm$^3$.

62. A glass mask blank preform as claimed in claim 57, wherein said silicon oxyfluoride glass has a chlorine content less than 10 ppm Cl.

63. A preform as claimed in claim 57, wherein said silicon oxyfluoride glass column has no detectable hydrogen.

64. A glass lithography mask blank consolidated preform for forming a lithography mask blank having a mask blank large dimension L and a mask blank thickness T, said mask blank preform comprising a silicon oxyfluoride glass column having less than $1 \times 10^{17}$ H$_2$ molecules/cm$^3$ and said glass column having a column height CH and a column radius CR wherein $CR \geq L/2$ and $CH \geq T$.

65. A glass mask blank preform as claimed in claim 64, wherein said silicon oxyfluoride glass has an OH content $\leq 10$ ppm, a F wt. % concentration $\geq 0.5$ wt. %.

66. A glass mask blank preform as claimed in claim 64, wherein said silicon oxyfluoride glass consists essentially of Si, O, and F.

67. A glass mask blank preform as claimed in claim 64, wherein said silicon oxyfluoride glass has a fluorine content in the range from 0.5 to 3 wt. % F.

68. A glass mask blank preform as claimed in claim 64, wherein said silicon oxyfluoride glass has a molecular H$_2$ content of less than $5 \times 10^{16}$ molecules/cm$^3$.

69. A glass mask blank preform as claimed in claim 64, wherein said silicon oxyfluoride glass has a chlorine content less than 10 ppm Cl.

70. A glass lithography mask blank formed from a glass lithography mask blank preform as claimed in claim 64, wherein said mask blank is comprised of a flat planar glass member having a top planar surface, a bottom planar surface, a mask blank large dimension L and a mask blank thickness T.

71. A preform as claimed in claim 64, wherein said silicon oxyfluoride glass column has no detectable hydrogen.

72. A lithography photomask blank comprising a flat planar silicon oxyfluoride glass member having a top planar surface and a bottom planar surface, said planar silicon oxyfluoride glass member having an OH content $\leq 10$ ppm, a F wt. % concentration $\geq 0.5$ wt. %, said silicon oxyfluoride glass having less than $1 \times 10^{17}$ H$_2$ molecules/cm$^3$ and said top planar surface has a surface roughness $\leq 0.15$ nm rms.

73. A lithography photomask blank as claimed in claim 72, wherein said planar silicon oxyfluoride glass member has a 157 nm light transmission percentage of at least 70% per 5 mm thickness of glass.

74. A lithography photomask blank as claimed in claim 72, wherein said silicon oxyfluoride glass consists essentially of Si, O, and F.

75. A photomask blank as claimed in claim 74, wherein said silicon oxyfluoride glass has less than $5 \times 10^{16}$ H$_2$ molecules/cm$^3$.

76. A photomask blank as claimed in claim 74, wherein said silicon oxyfluoride glass has no detectable hydrogen.

77. A lithography photomask blank as claimed in claim 72, wherein said silicon oxyfluoride glass has a F wt. % content in the range from 0.5 wt. % to 3 wt. %.

78. A lithography photomask blank as claimed in claim 72, wherein said flat planar silicon oxyfluoride glass member has a transmission uniformity at 157 nm in the range from −2% to +2%.

79. A lithography photomask blank as claimed in claim 72, wherein said silicon oxyfluoride glass member is free of inclusions having a dimension >1 µm.

80. A lithography photomask blank as claimed in claim 72, wherein said silicon oxyfluoride glass member has a birefringence $\leq 5$ nm/cm.

81. A lithography photomask blank claimed in claim 72, wherein said flat planar silicon oxyfluoride glass member has a thickness of at least 0.6 cm, a length of at least 15 cm, is free of inclusions having a dimension >1 µm, a transmission uniformity at 157 nm in the range from −2 to +2%, transmission at 157 nm >70%, and a birefringence $\leq 5$ nm/cm.

* * * * *